US010529765B2

(12) United States Patent
Togashi

(10) Patent No.: US 10,529,765 B2
(45) Date of Patent: *Jan. 7, 2020

(54) SOLID-STATE IMAGING DEVICE HAVING THROUGH ELECTRODE PROVIDED THEREIN AND ELECTRONIC APPARATUS INCLUDING THE SOLID-STATE IMAGING DEVICE

(71) Applicant: SONY CORPORATION, Tokyo (JP)

(72) Inventor: Hideaki Togashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 28 days.

This patent is subject to a terminal disclaimer.

(21) Appl. No.: 15/619,077

(22) Filed: Jun. 9, 2017

(65) Prior Publication Data
US 2018/0006073 A1    Jan. 4, 2018

Related U.S. Application Data

(63) Continuation of application No. 14/911,538, filed as application No. PCT/JP2014/070842 on Aug. 7, 2014, now Pat. No. 9,698,188.

(30) Foreign Application Priority Data

Aug. 19, 2013    (JP) .................................. 2013-169553

(51) Int. Cl.
*H01L 27/14*    (2006.01)
*H01L 27/146*   (2006.01)
(Continued)

(52) U.S. Cl.
CPC .. *H01L 27/14636* (2013.01); *H01L 21/76898* (2013.01); *H01L 23/481* (2013.01);
(Continued)

(58) Field of Classification Search
CPC ......... H01L 27/14636; H01L 27/14643; H01L 21/76898; H01L 27/1464; H01L 27/14647;
(Continued)

(56) References Cited

U.S. PATENT DOCUMENTS

| | | | |
|---|---|---|---|
| 2011/0019042 A1* | 1/2011 | Yamaguchi ....... | H01L 27/14632 348/280 |
| 2012/0013022 A1* | 1/2012 | Sabuncuoglu Tezcan ................... | H01L 21/7682 257/774 |
| 2012/0061786 A1* | 3/2012 | Hutto ................ | H01L 21/76898 257/432 |

FOREIGN PATENT DOCUMENTS

CN    102856333    1/2013

OTHER PUBLICATIONS

Official Action (with English translation) for Chinese Patent Application No. 201480042659.1, dated Mar. 20, 2018, 22 pages.

\* cited by examiner

*Primary Examiner* — Daniel Whalen
(74) *Attorney, Agent, or Firm* — Sheridan Ross P.C.

(57) ABSTRACT

There is provided a solid-state imaging device including: one or more photoelectric conversion elements provided on side of a first surface of a semiconductor substrate; a through electrode coupled to the one or more photoelectric conversion elements, and provided between the first surface and a second surface of the semiconductor substrate; and an amplifier transistor and a floating diffusion provided on the second surface of the semiconductor substrate, in which the one or more photoelectric conversion elements are coupled to a gate of the amplifier transistor and the floating diffusion via the through electrode.

20 Claims, 27 Drawing Sheets

(51) Int. Cl.
*H01L 23/48* (2006.01)
*H01L 21/768* (2006.01)
*H04N 5/3745* (2011.01)
*H04N 5/369* (2011.01)
*H04N 5/378* (2011.01)

(52) U.S. Cl.
CPC .... *H01L 27/1464* (2013.01); *H01L 27/14643* (2013.01); *H01L 27/14647* (2013.01); *H04N 5/379* (2018.08); *H04N 5/3745* (2013.01); *H01L 21/7682* (2013.01); *H01L 2924/0002* (2013.01); *H04N 5/378* (2013.01)

(58) Field of Classification Search
CPC ............... H01L 23/481; H01L 21/7682; H01L 2924/0002; H04N 5/3745; H04N 5/378
See application file for complete search history.

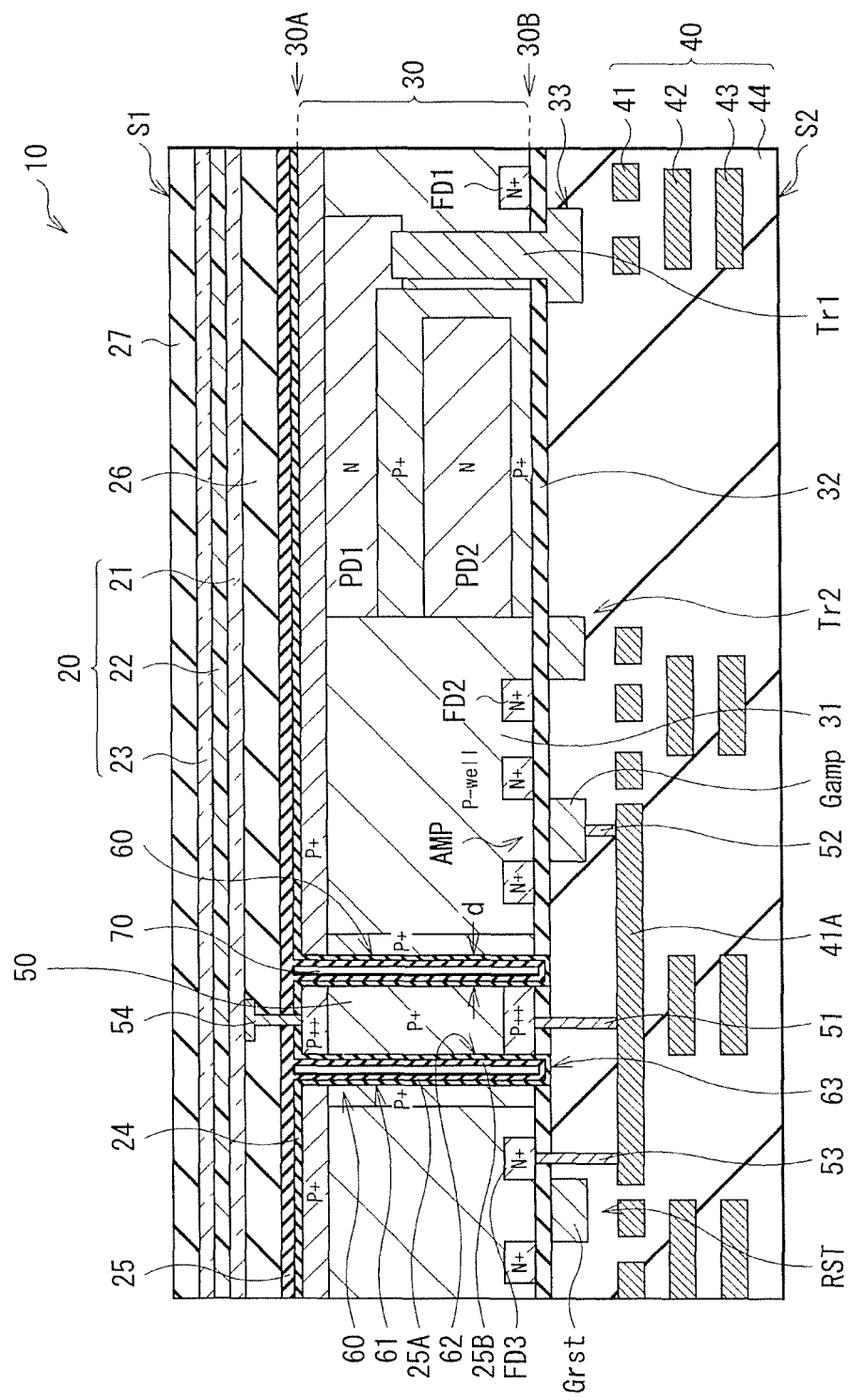
[FIG. 1]

[FIG. 2]
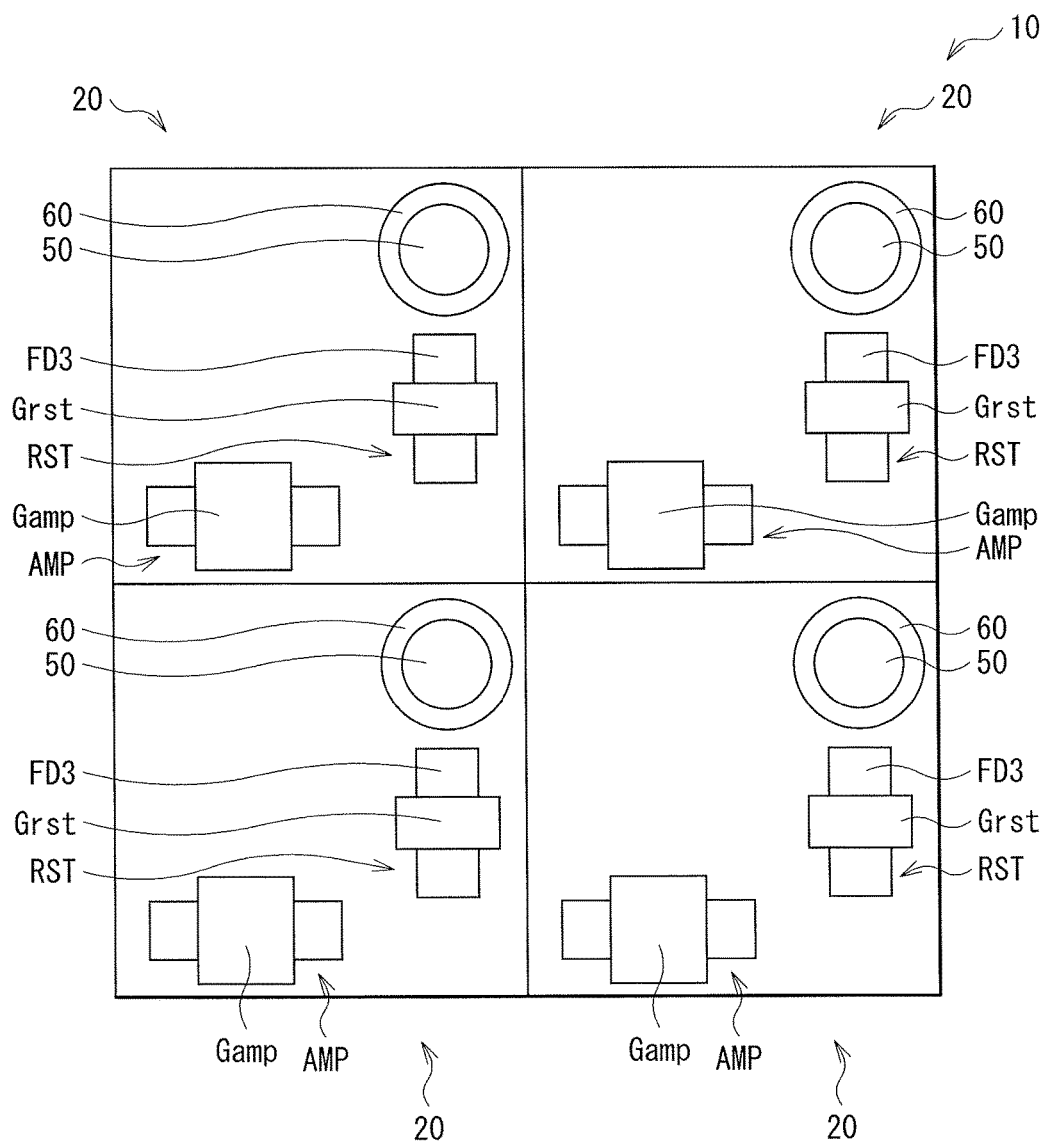

[FIG. 3]
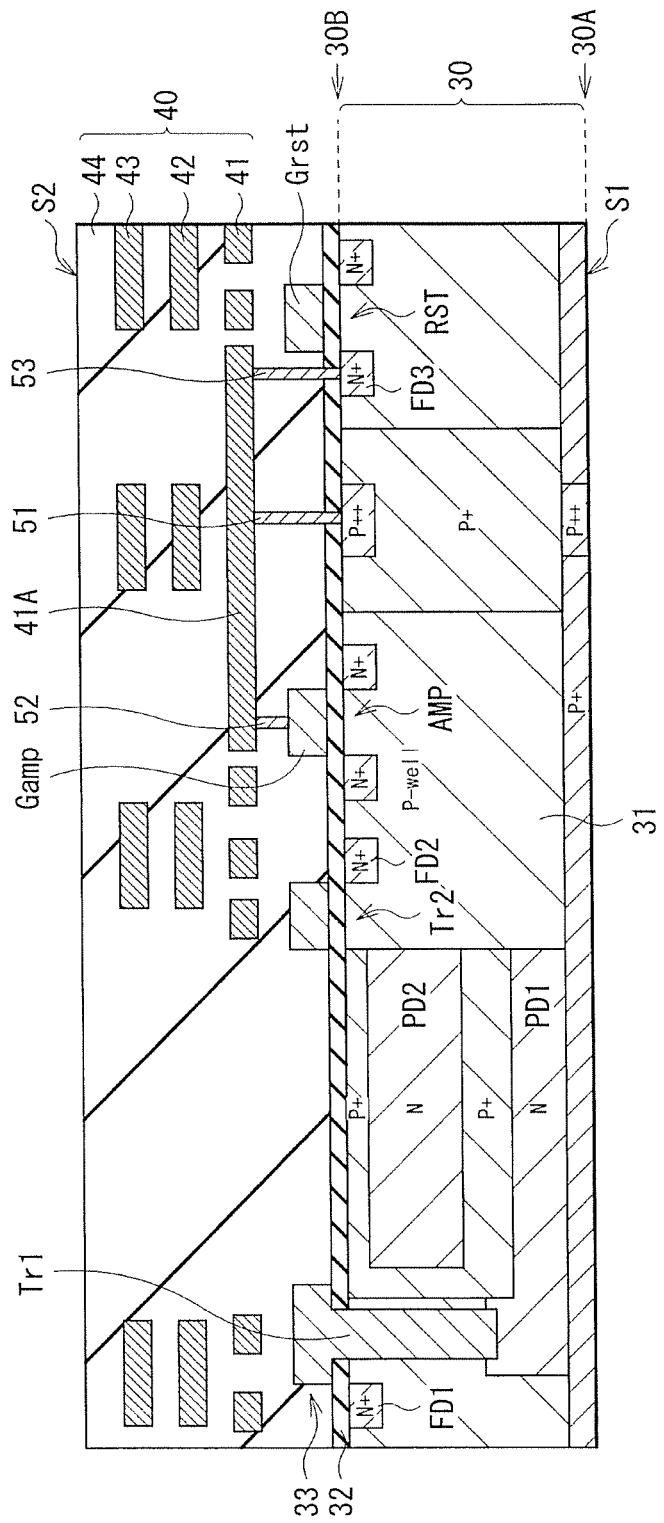

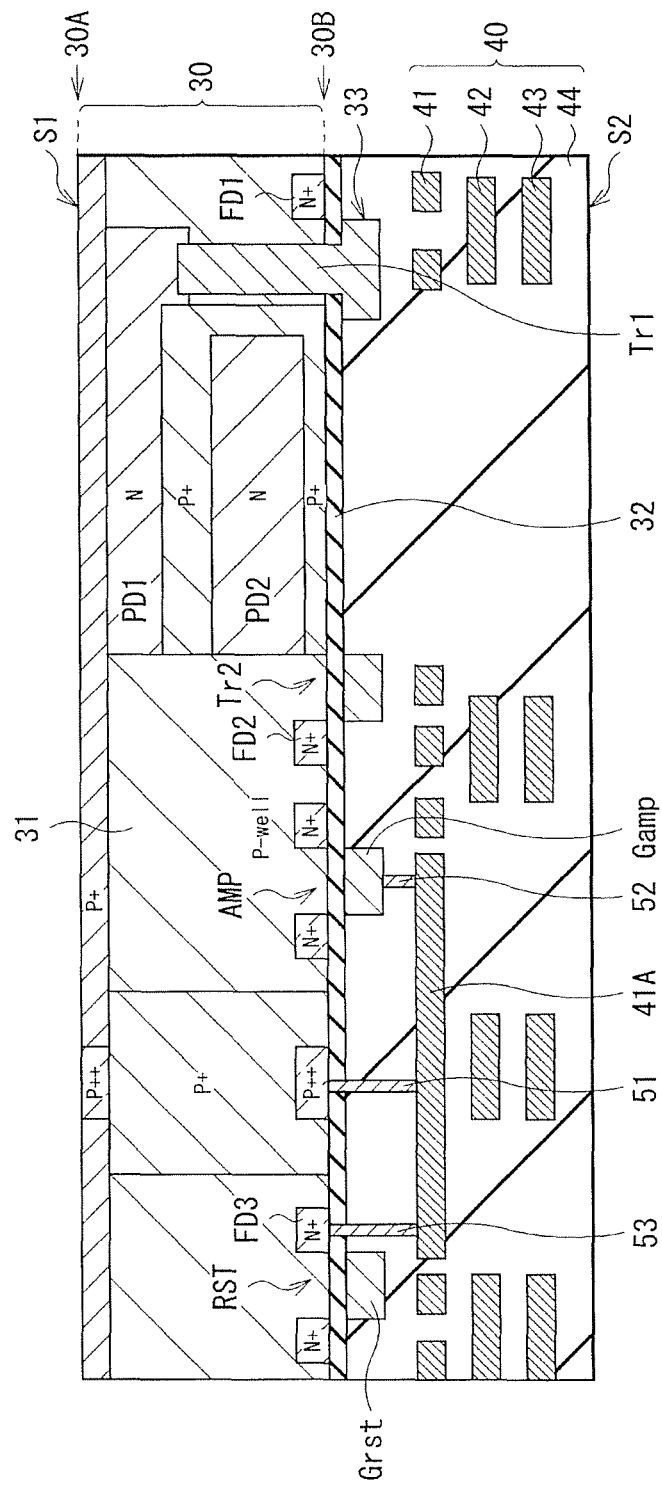
[FIG. 4]

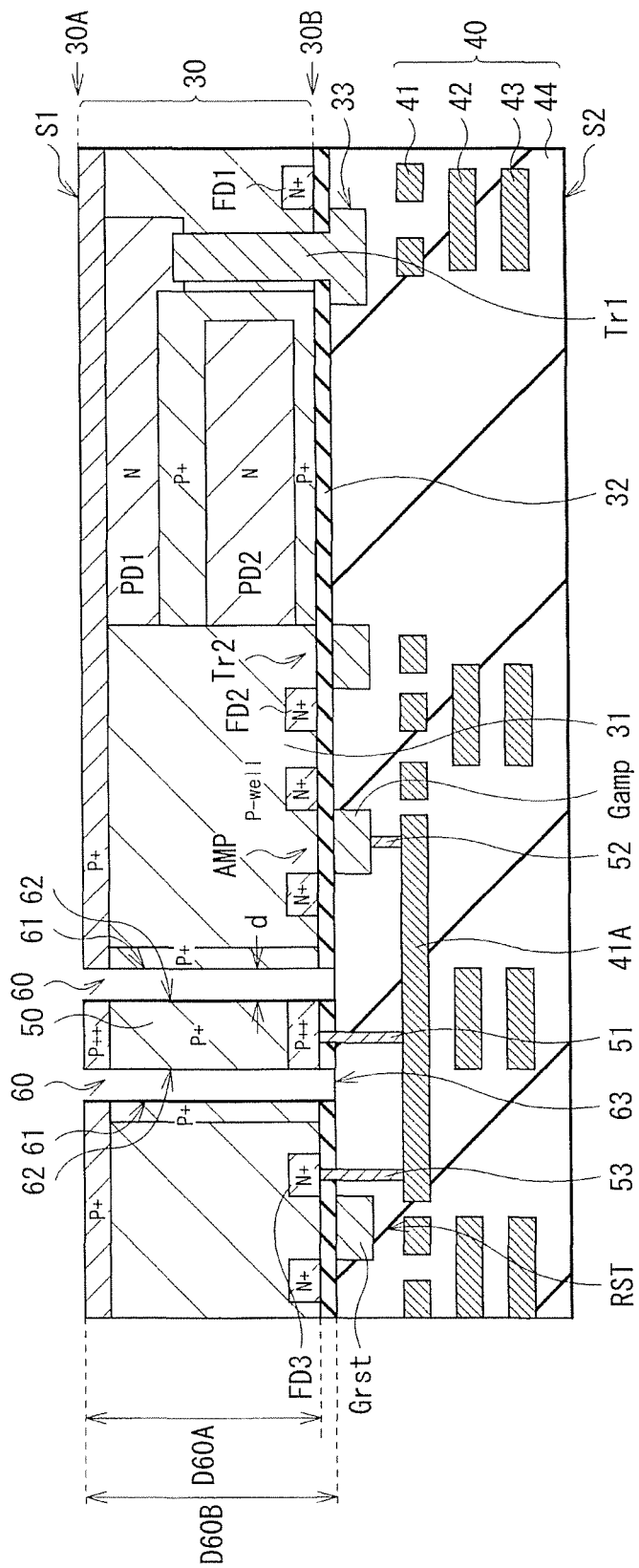
[FIG. 5]

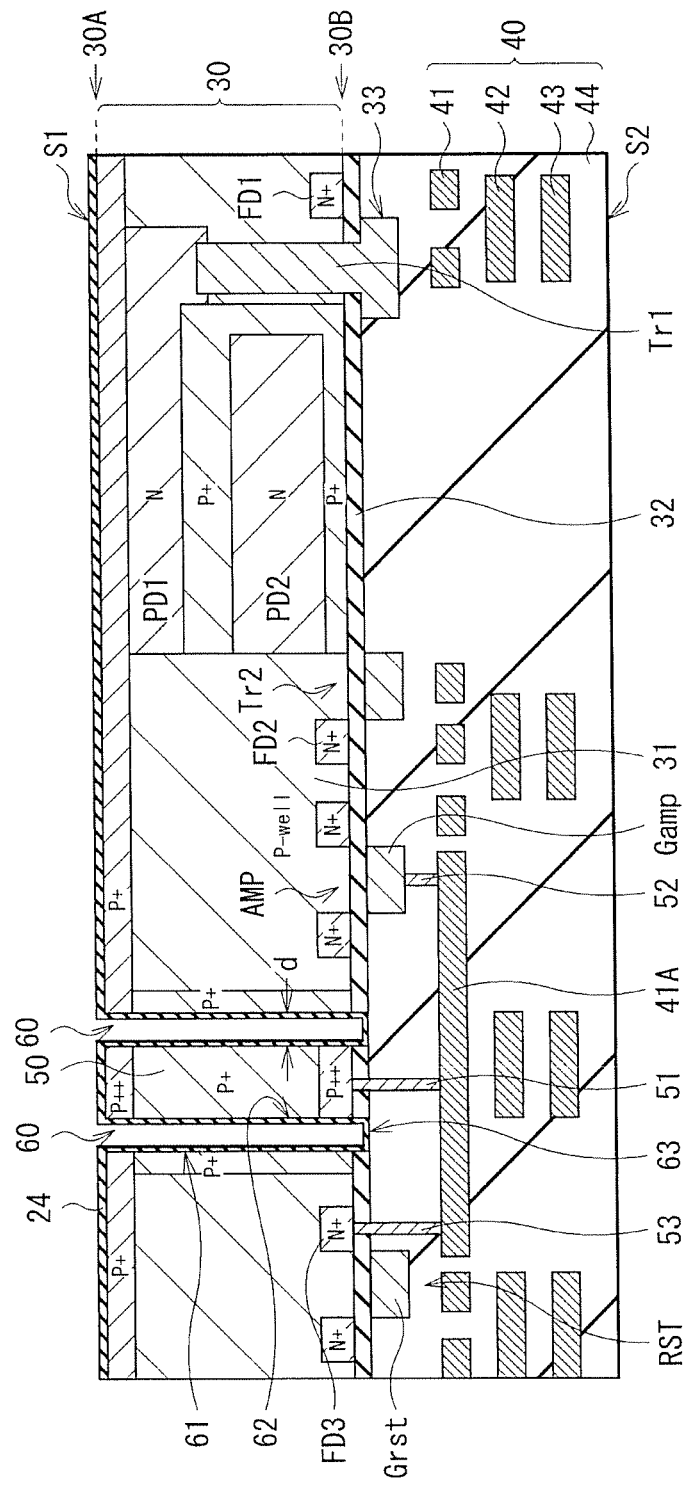
[FIG. 6]

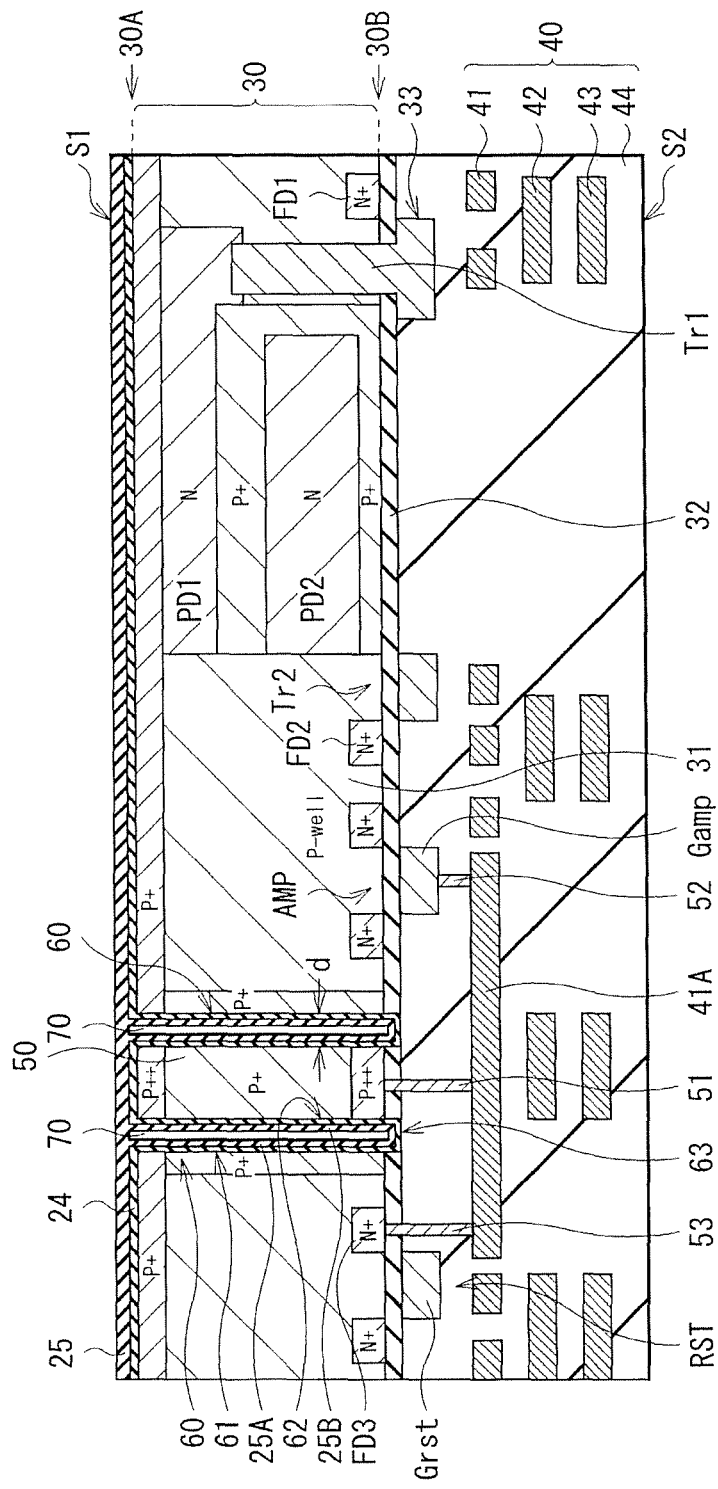
[FIG. 7]

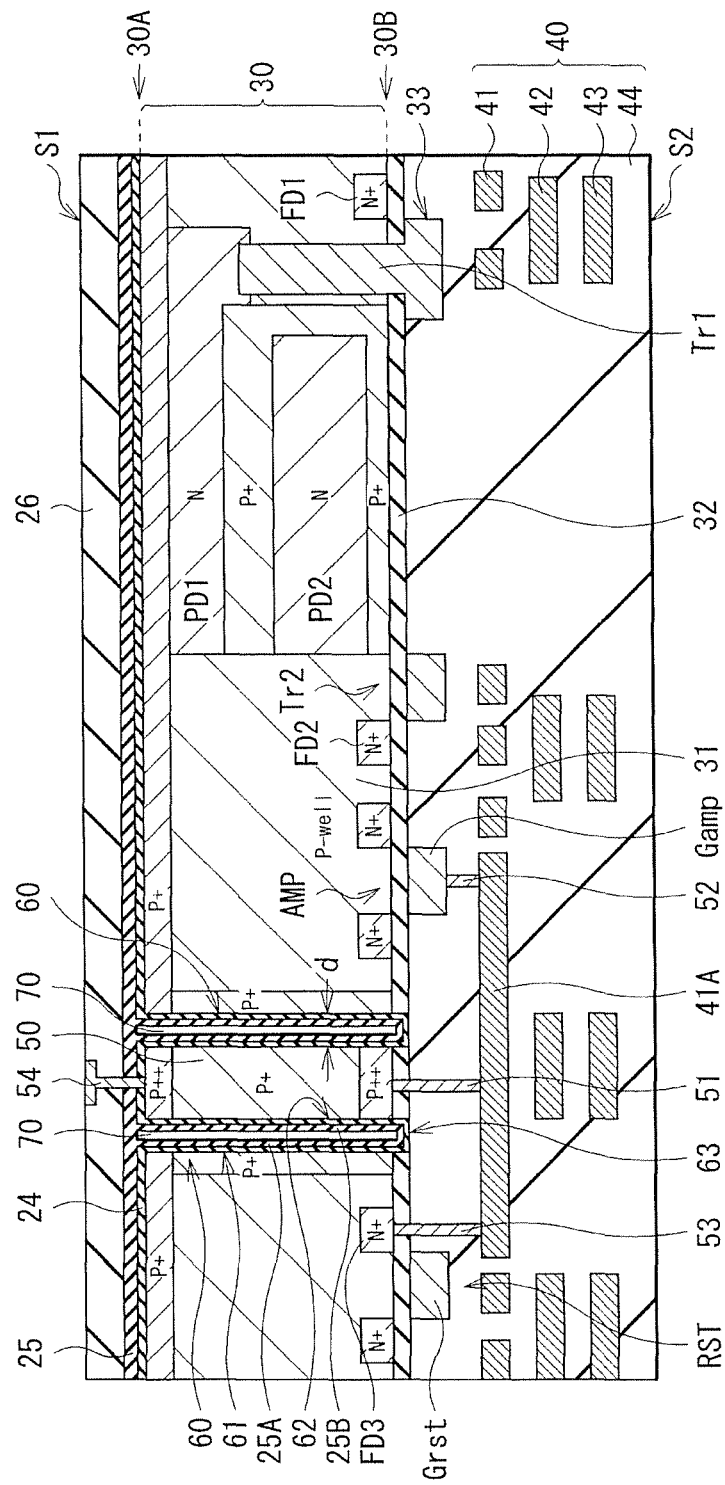
[FIG. 8]

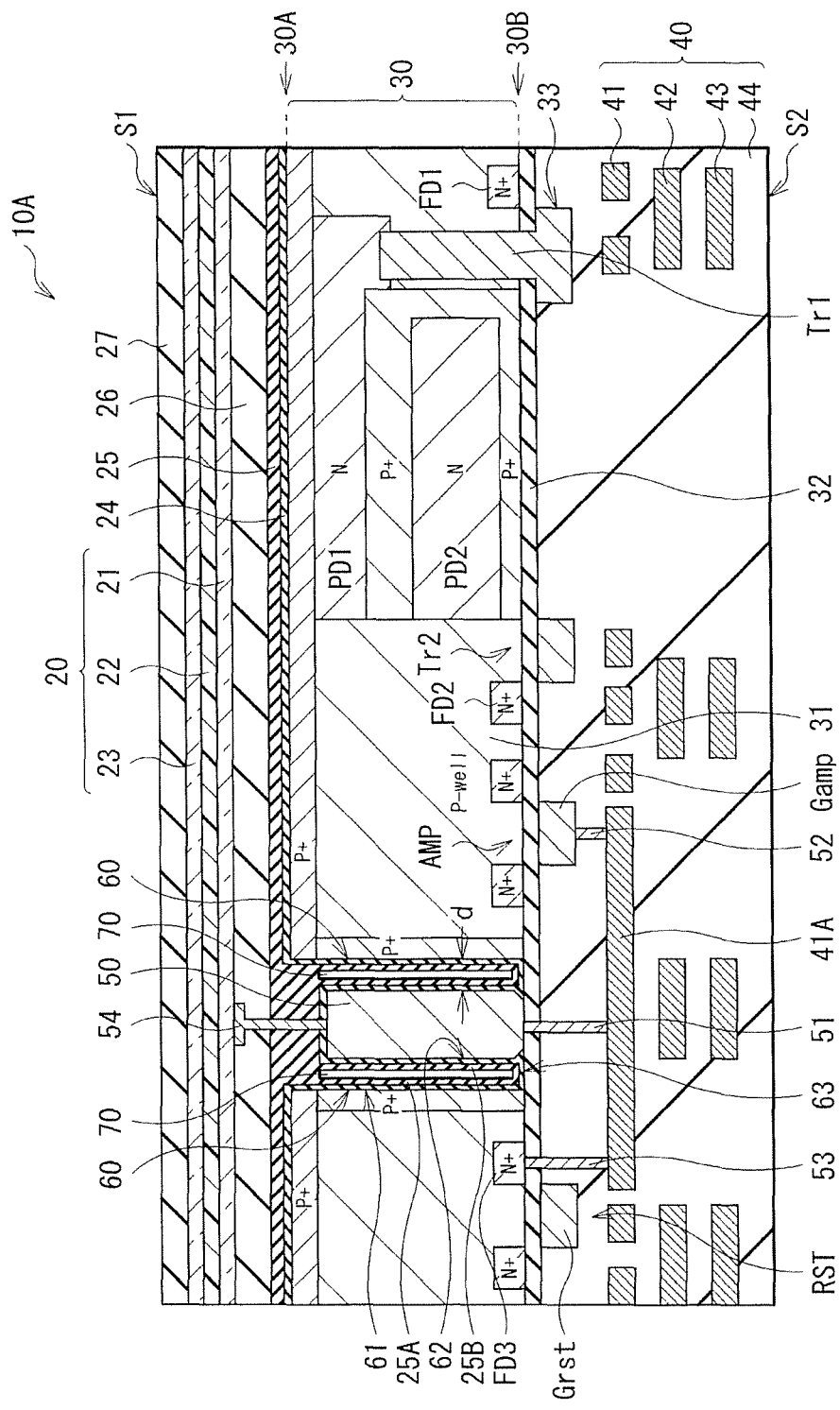
[FIG. 9]

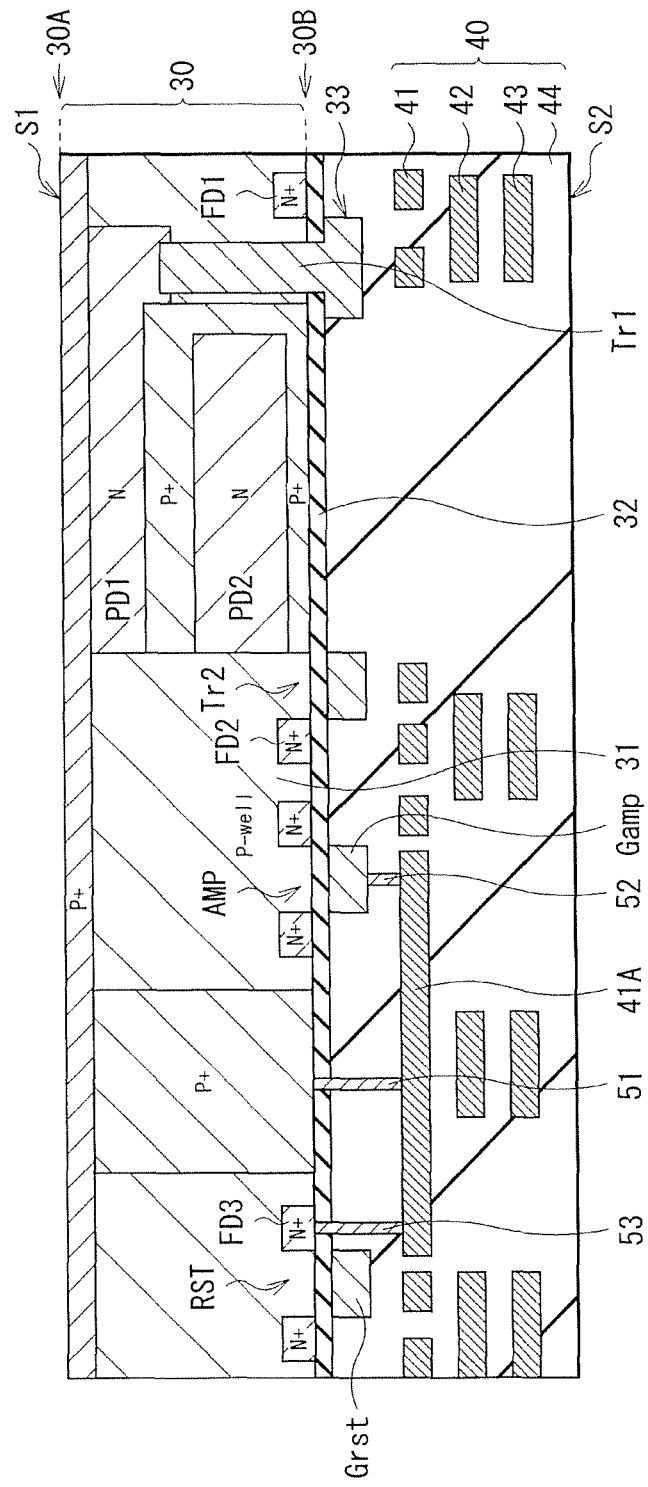
[FIG. 10]

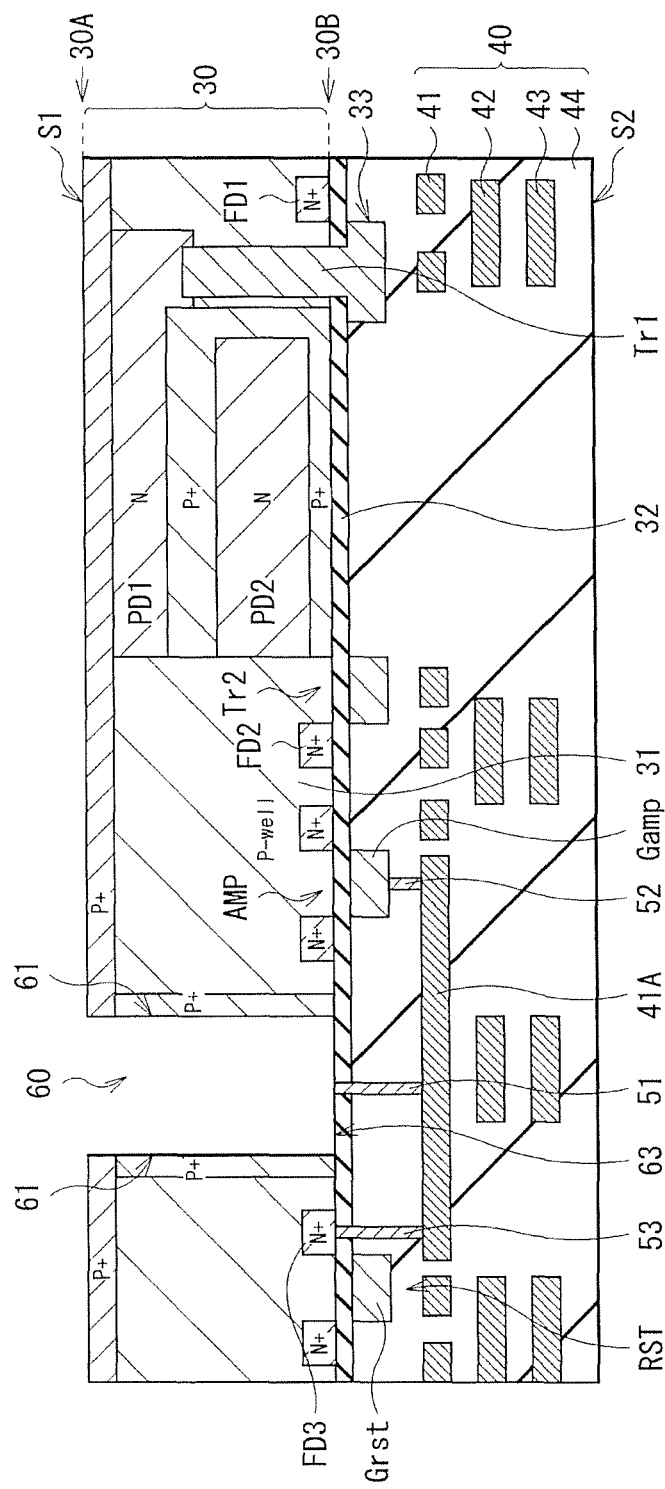
[ FIG. 11 ]

[FIG. 12]
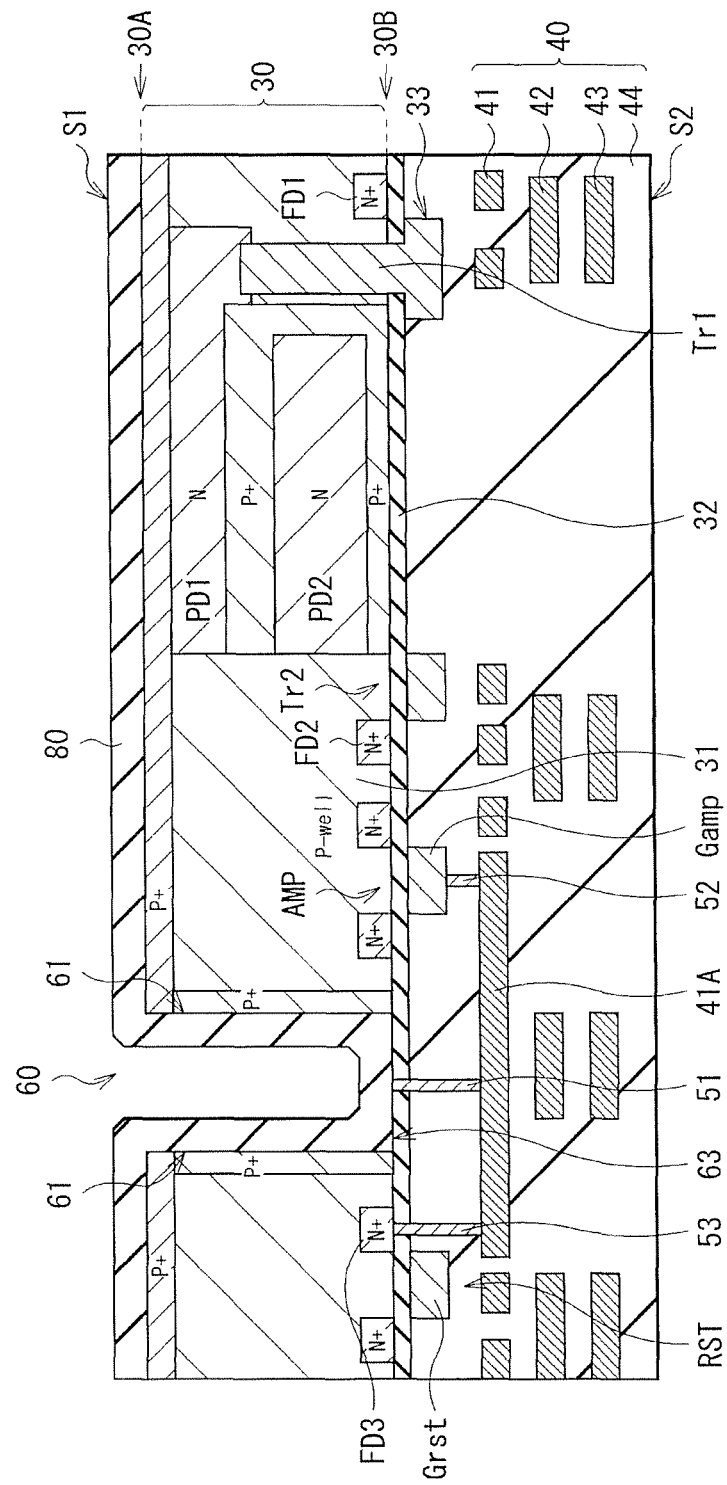

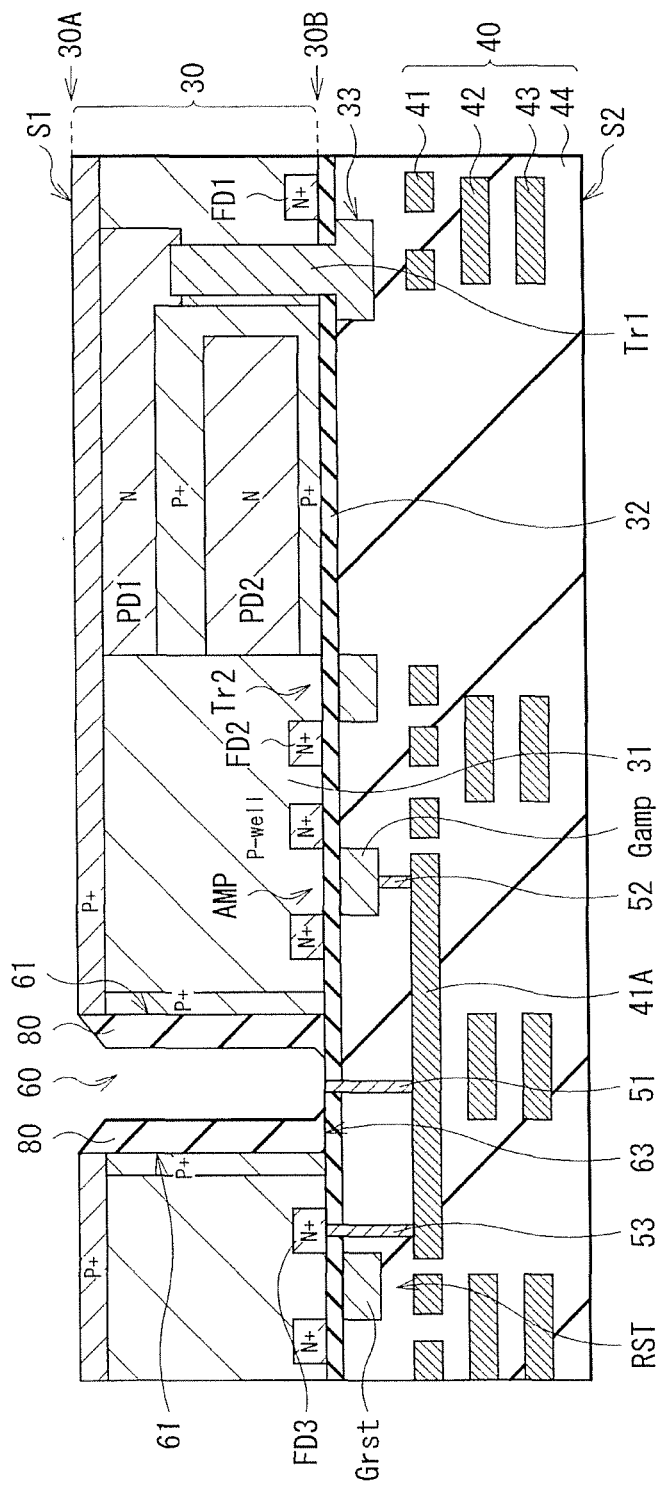
[FIG. 13]

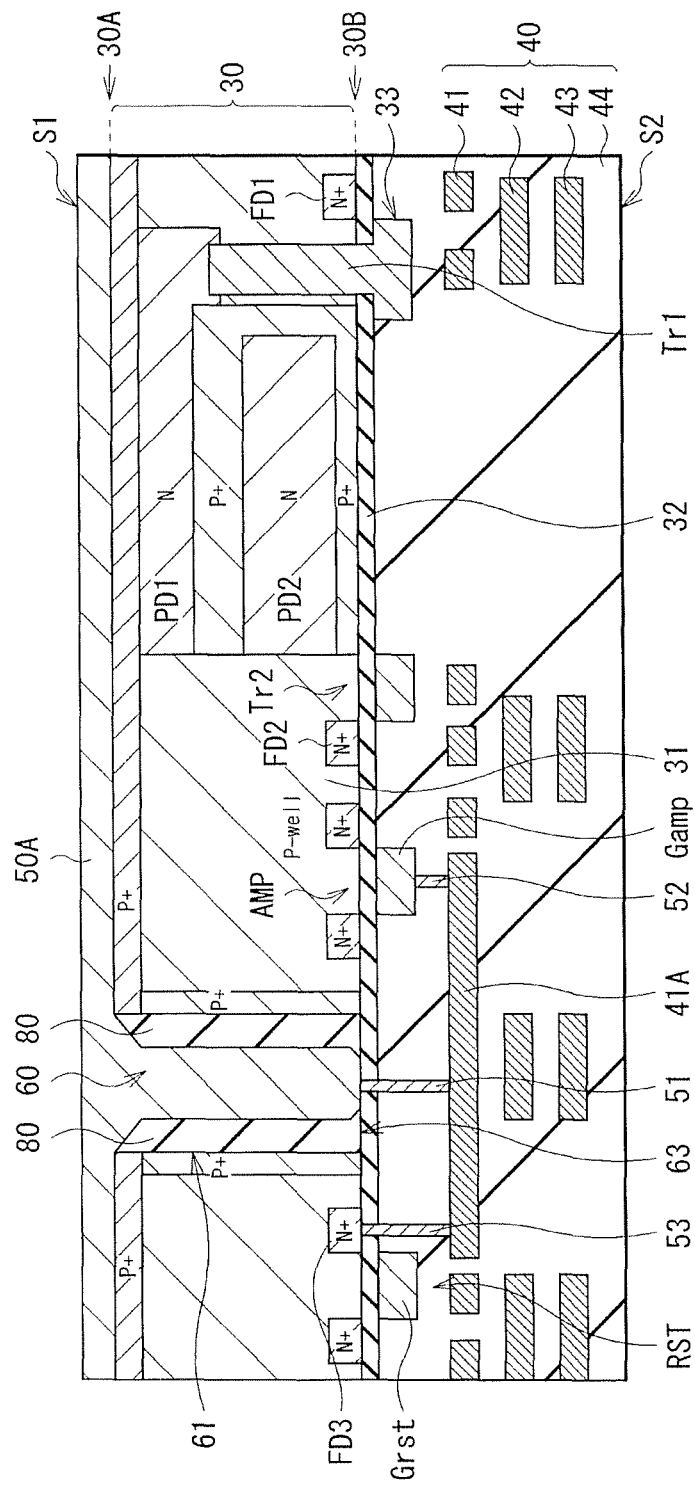
[ FIG. 14 ]

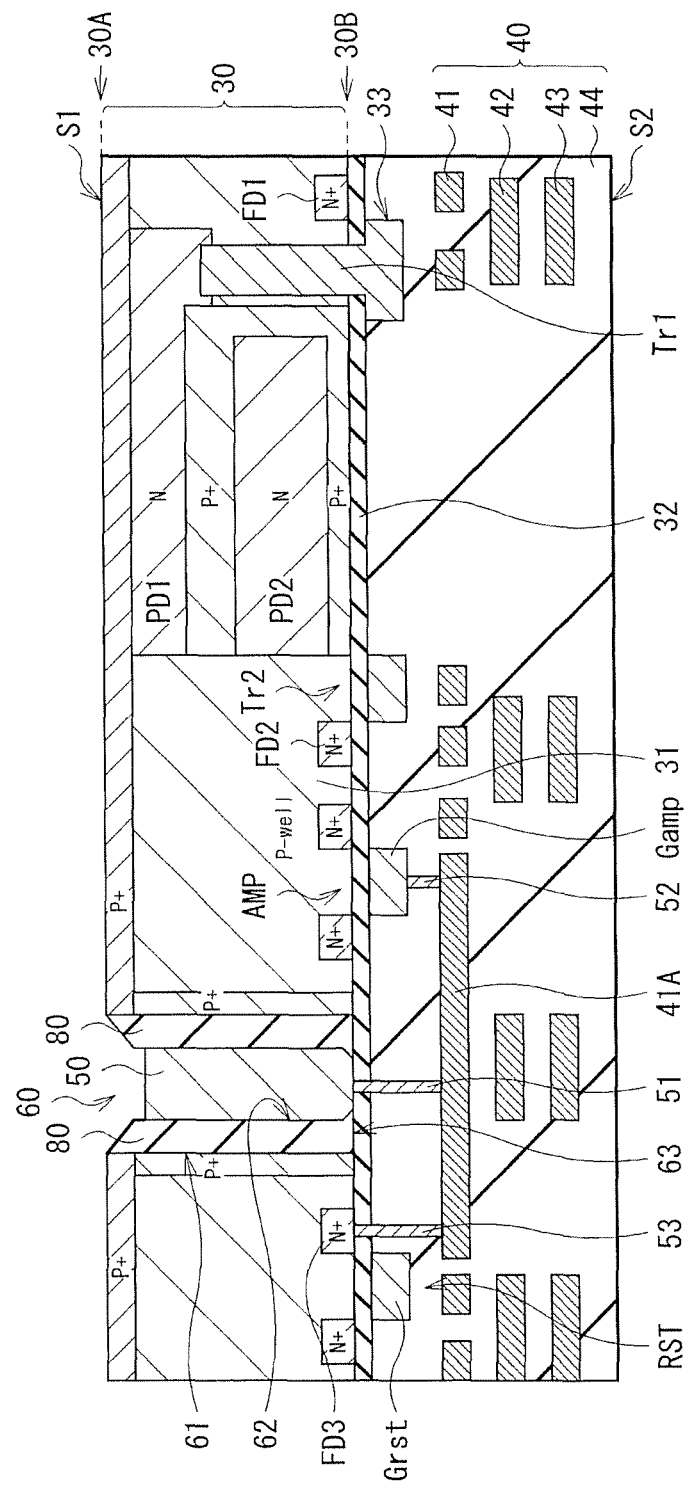
[FIG. 15]

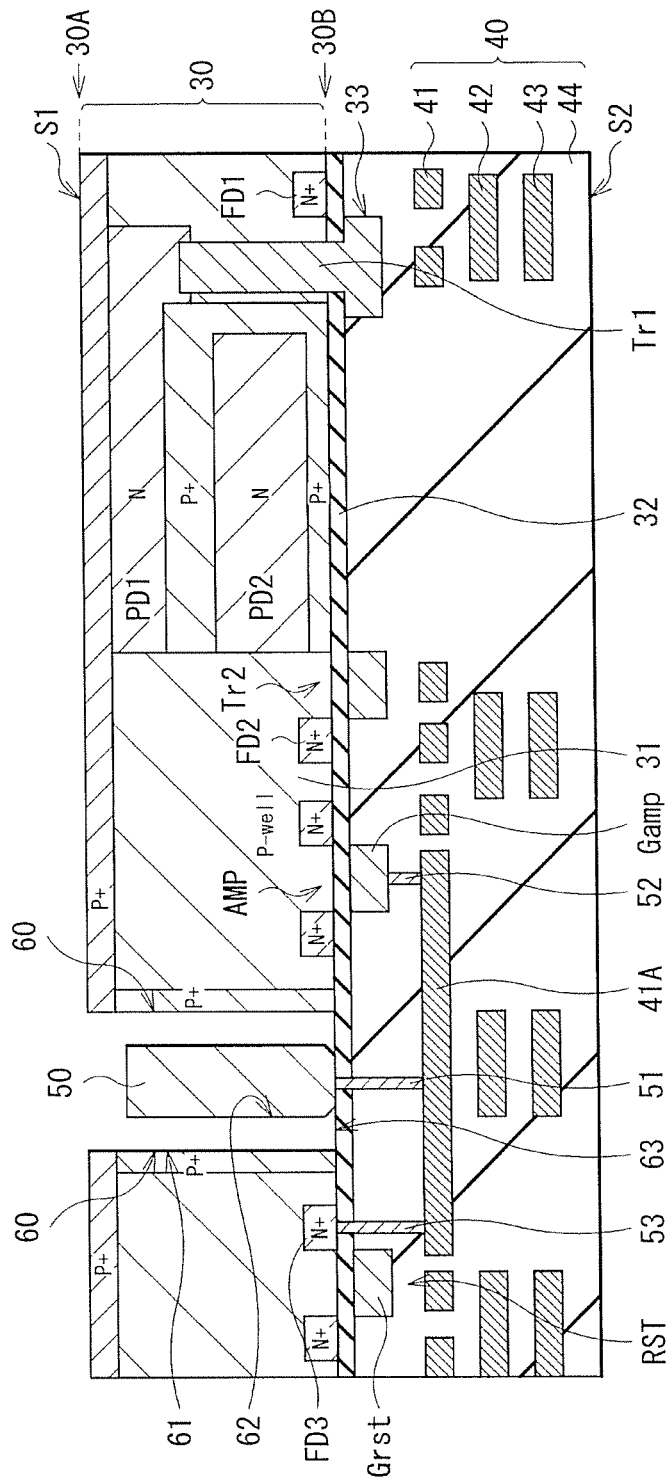
[FIG. 16]

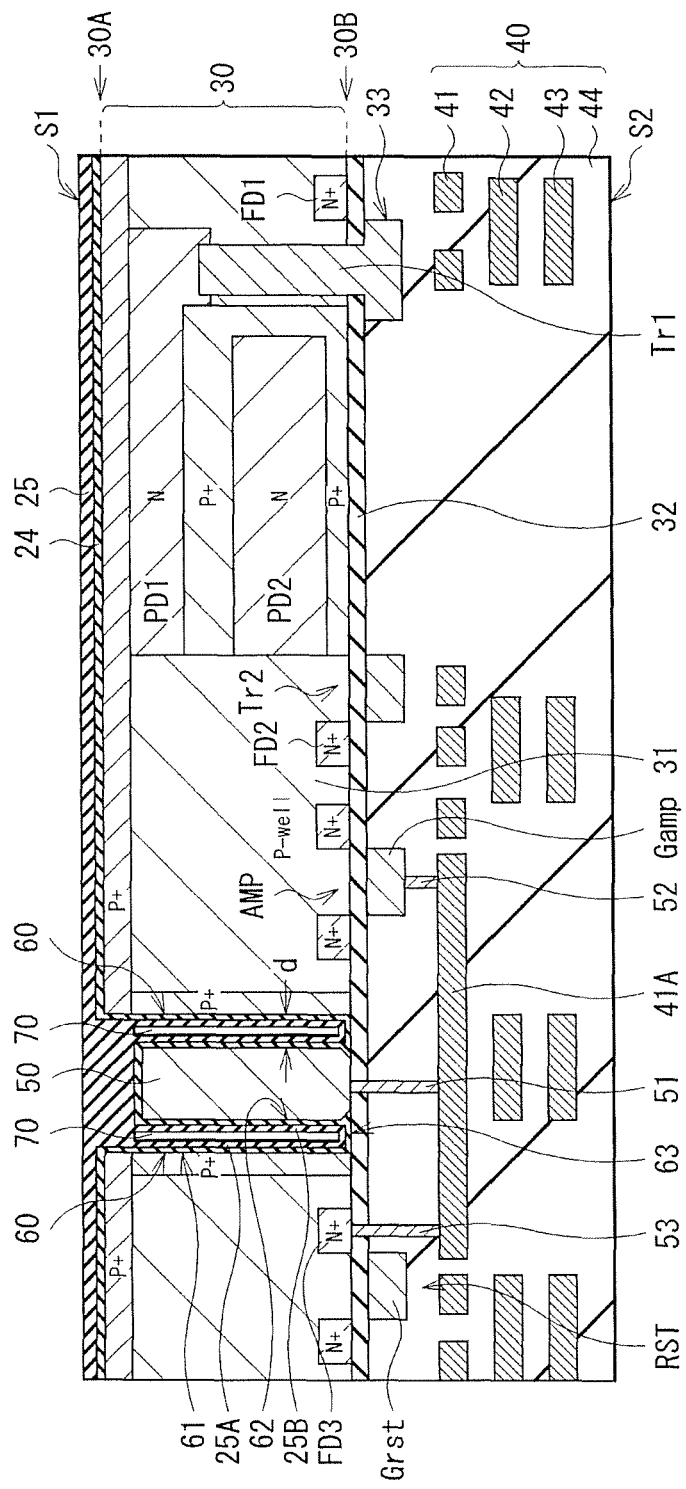
[FIG. 17]

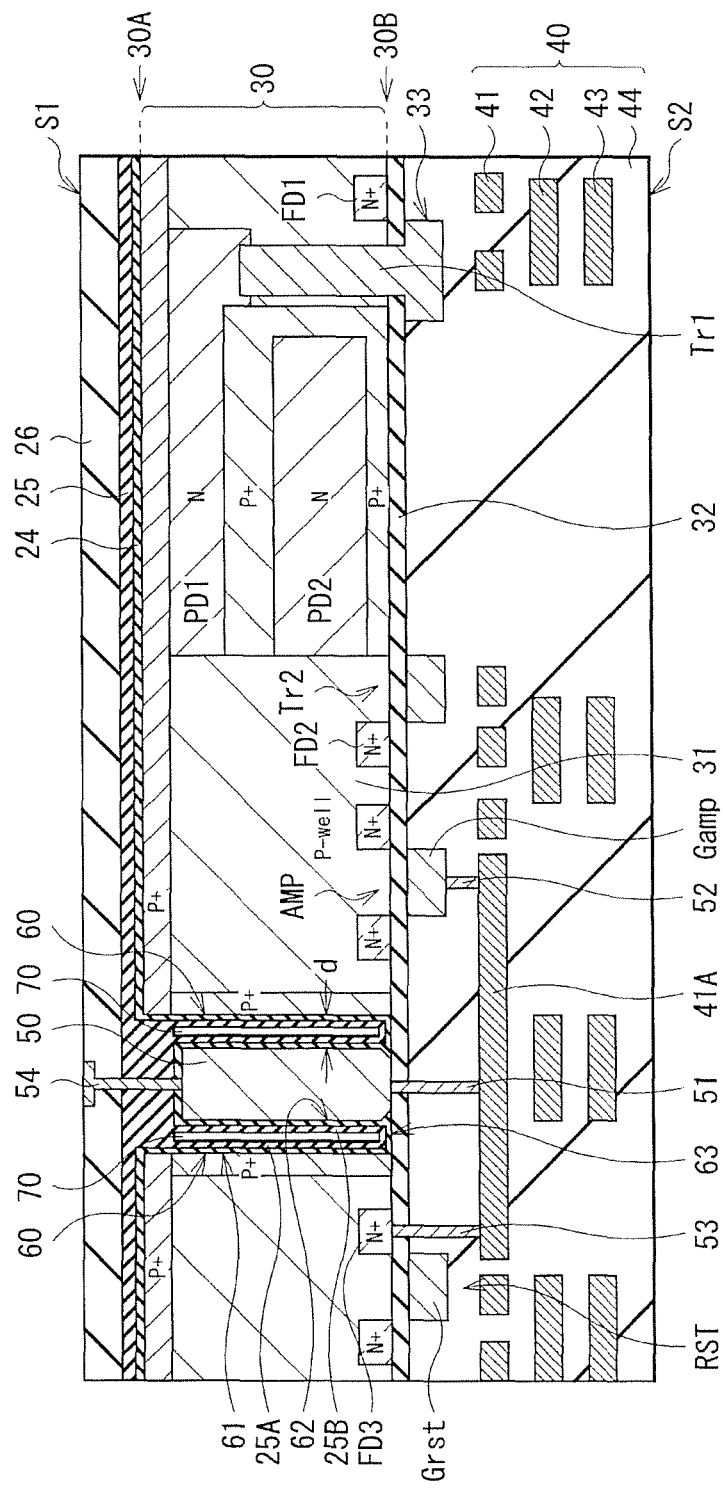
[FIG. 18]

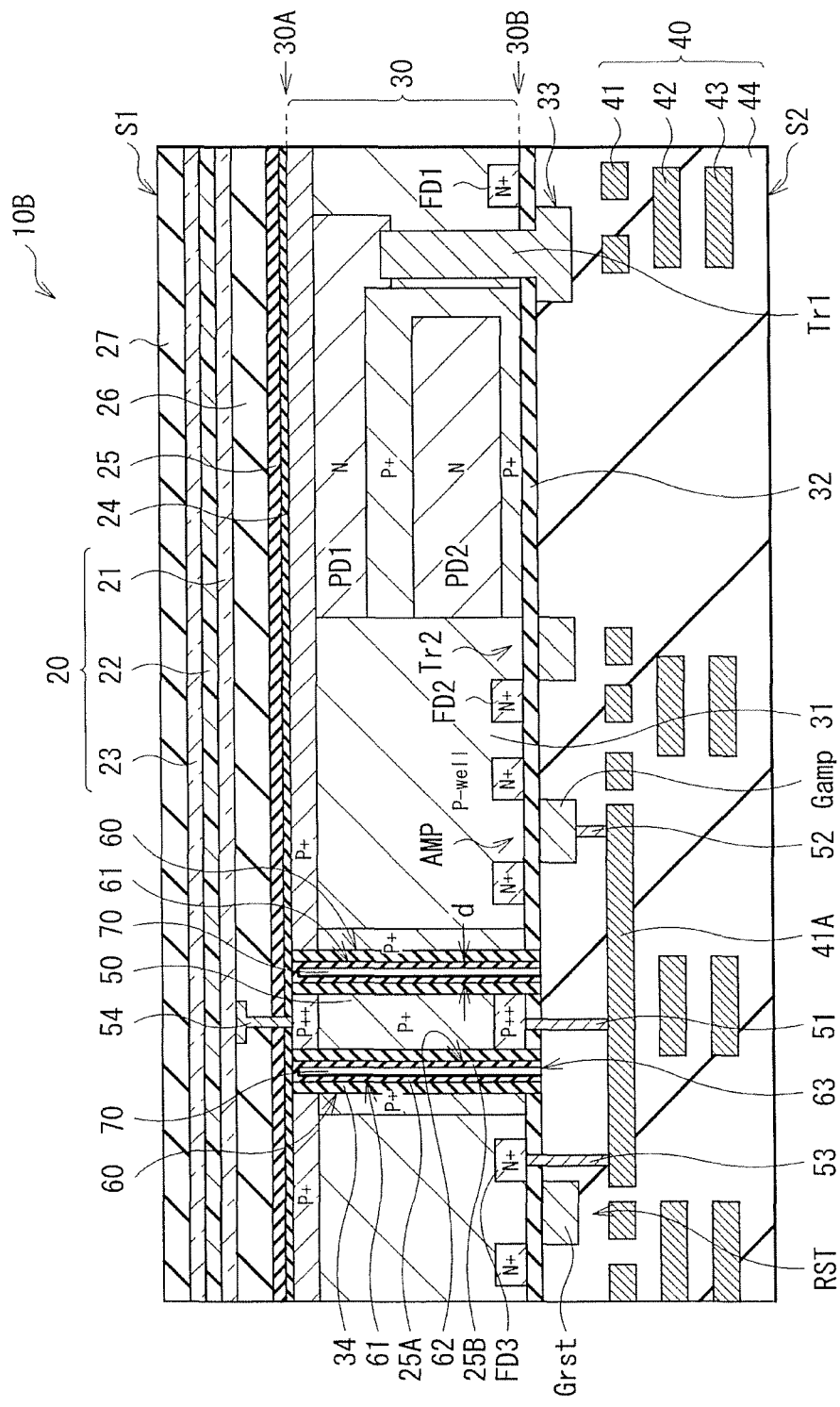
[FIG. 19]

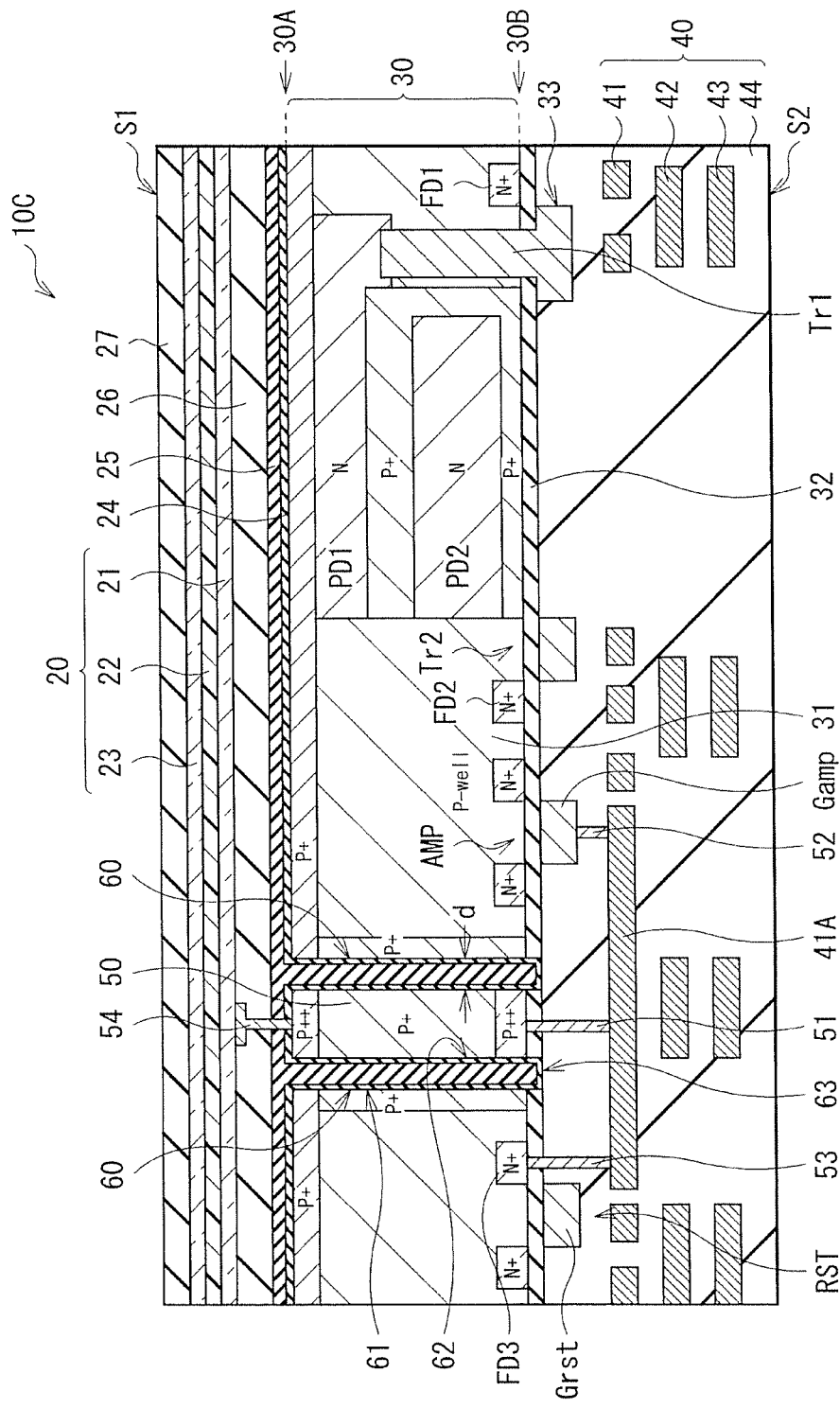
[FIG. 20]

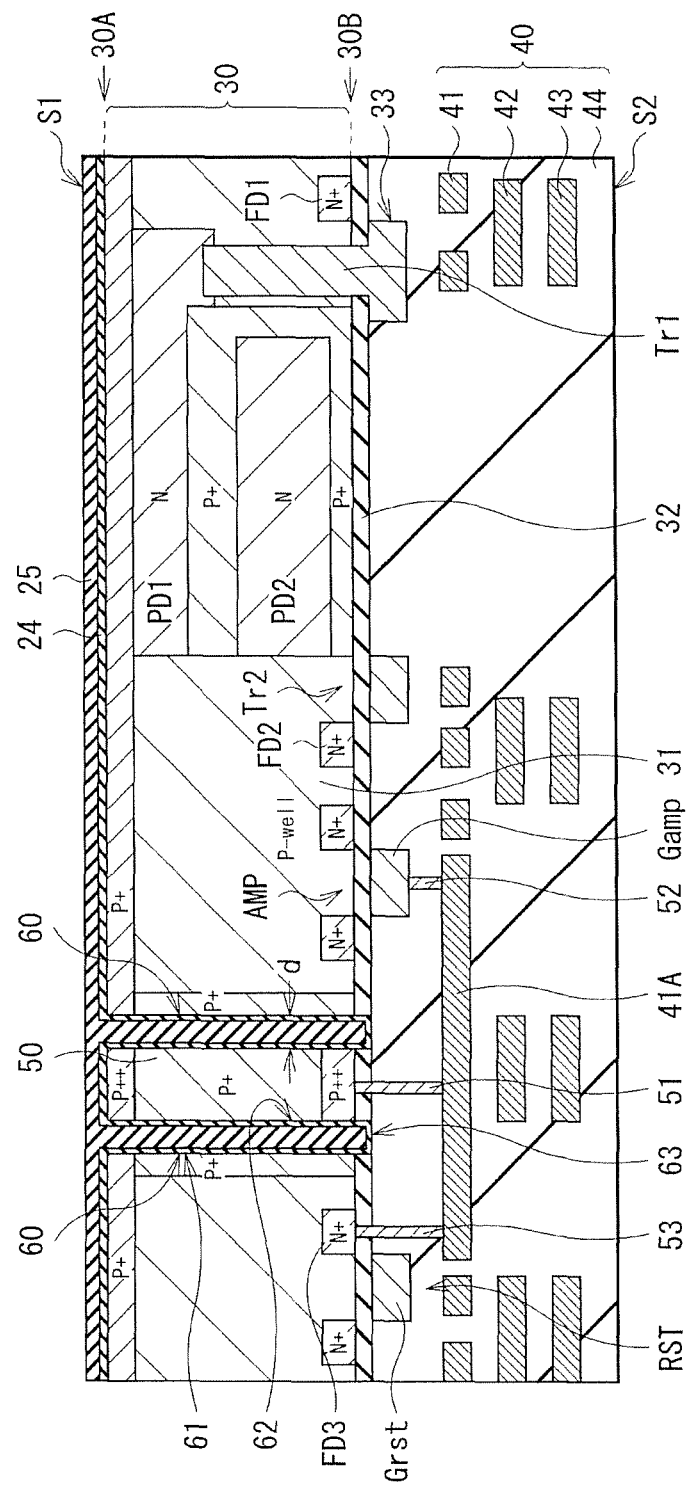
[FIG. 21]

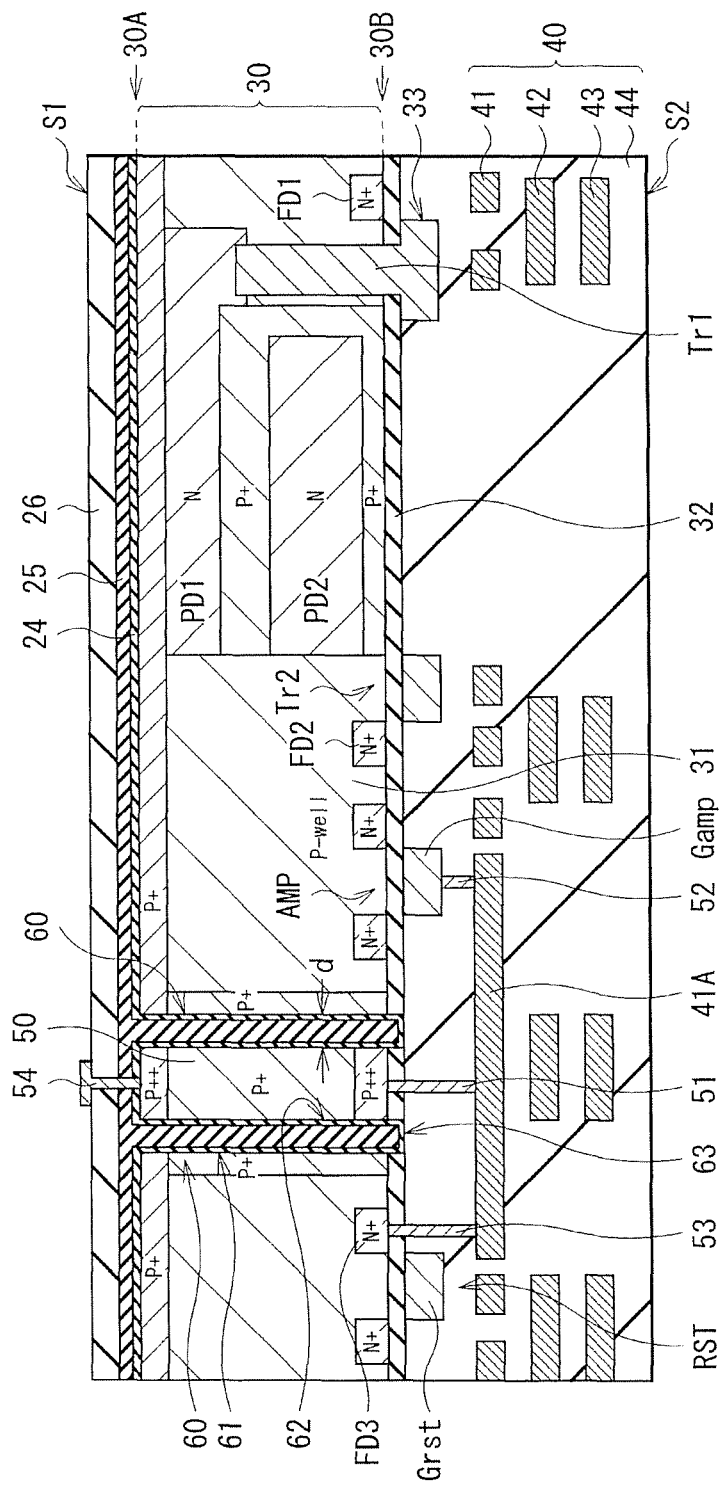
[FIG. 22]

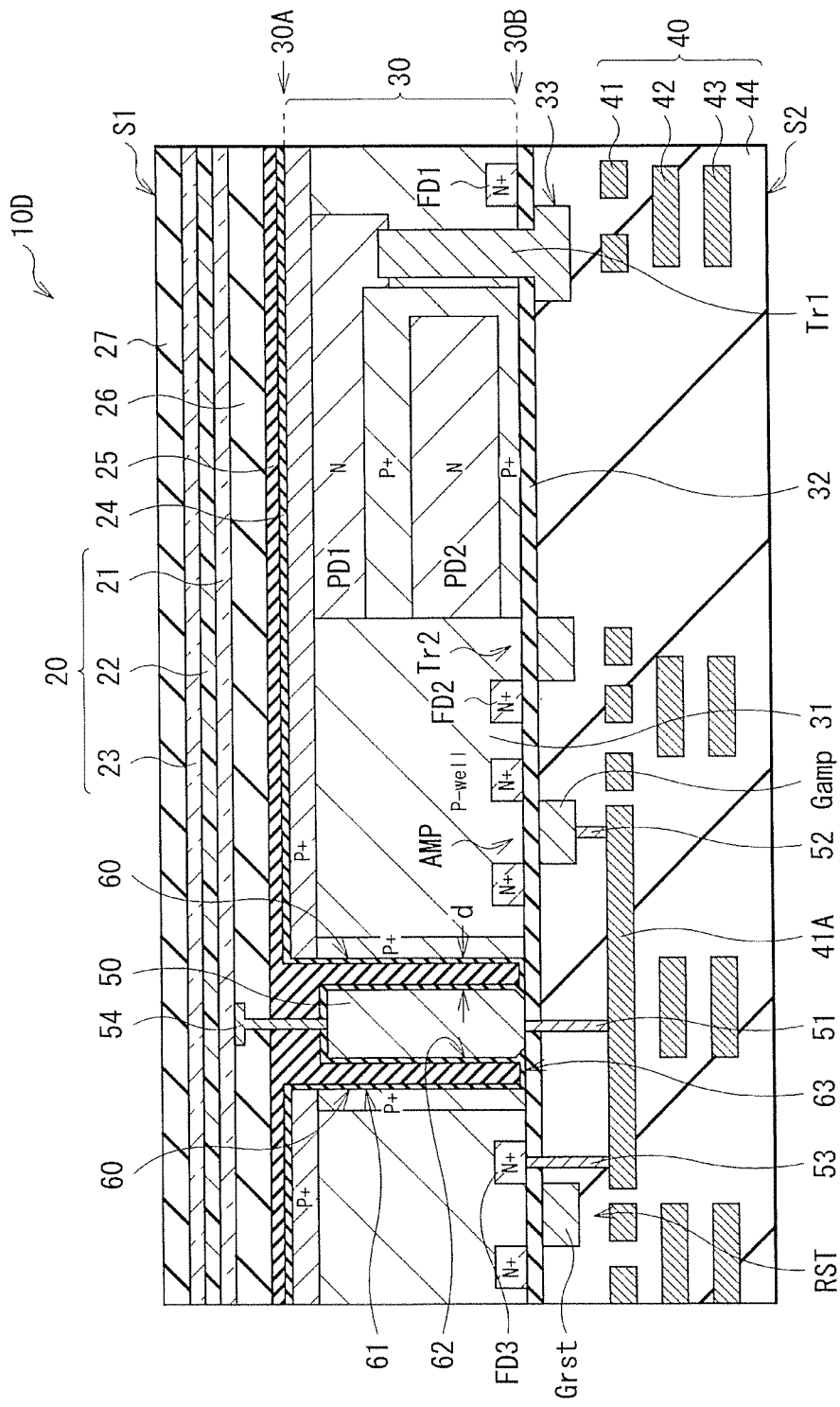
[FIG. 23]

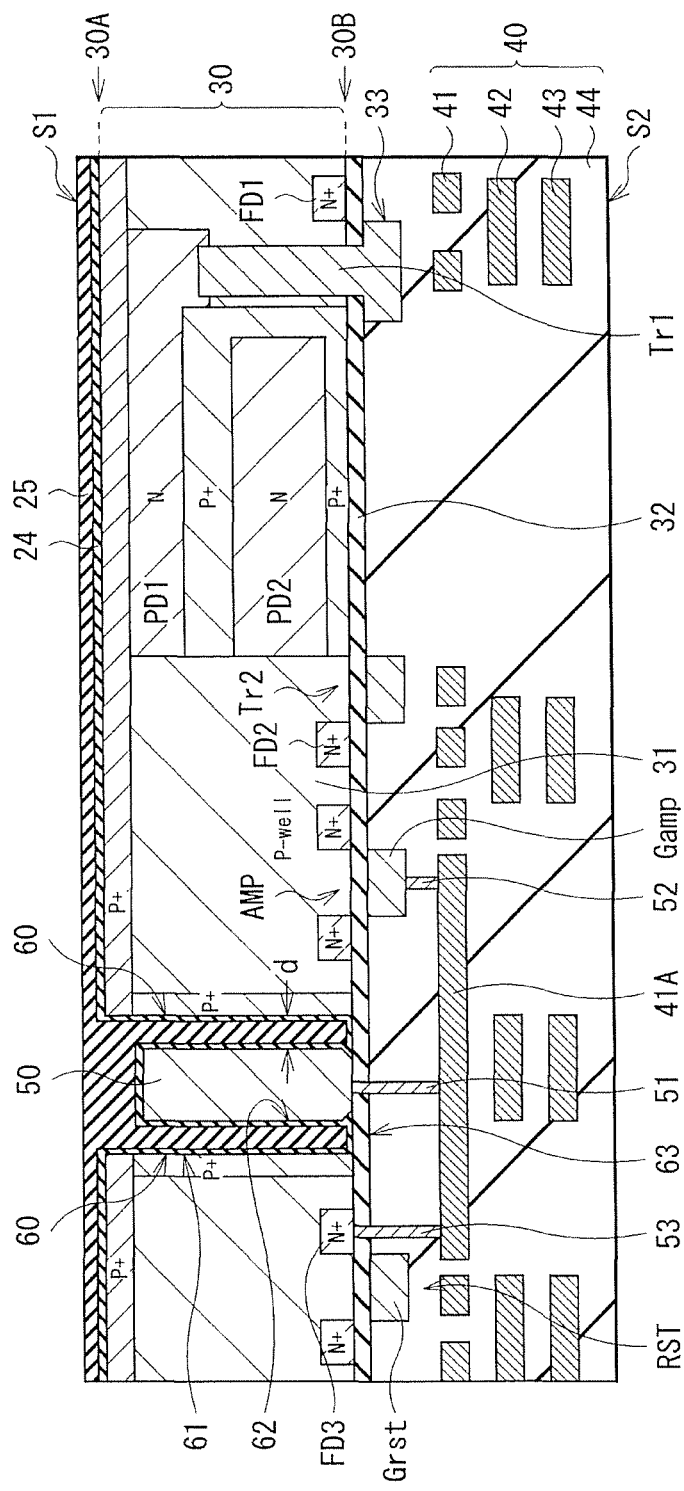
[ FIG. 24 ]

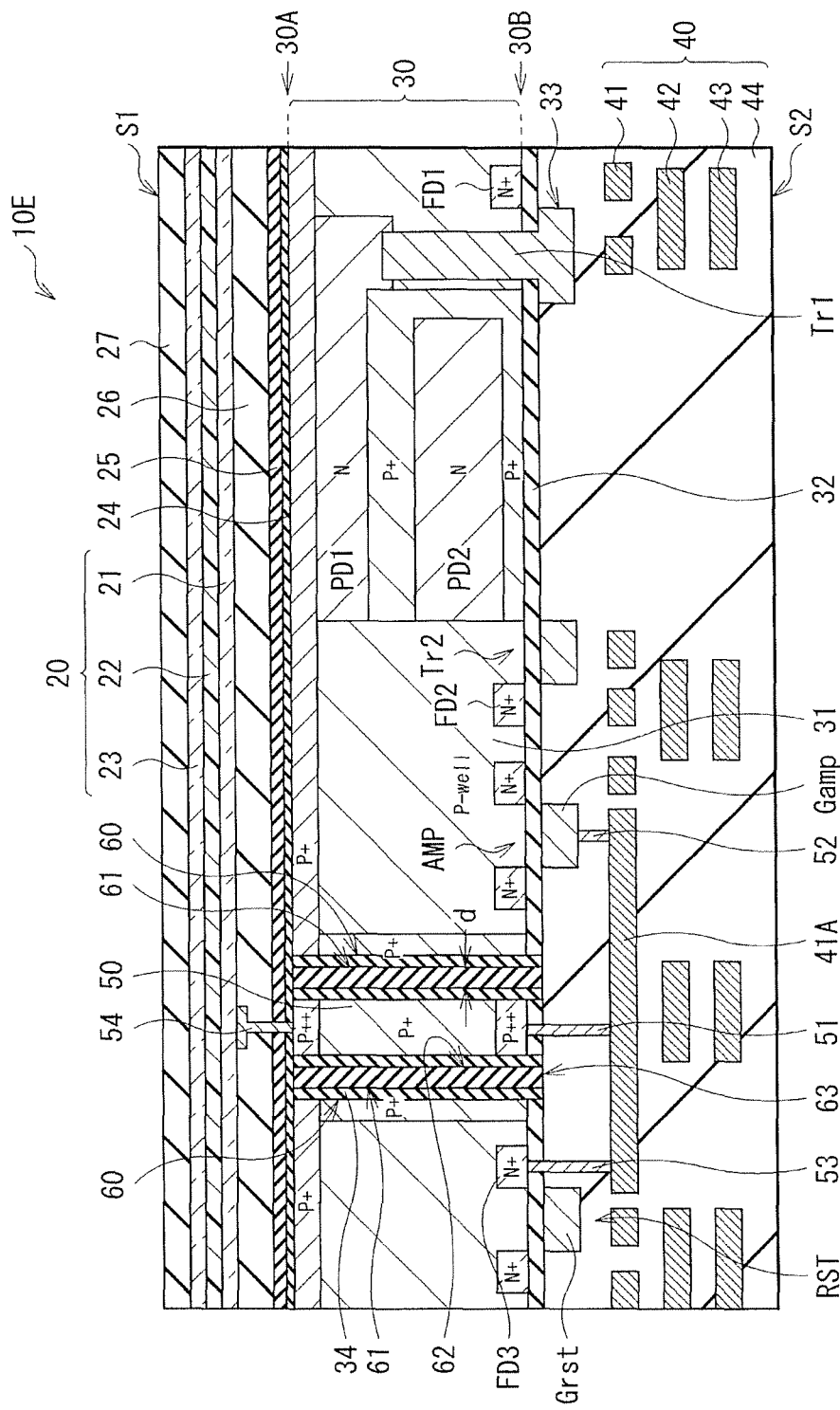
[FIG. 25]

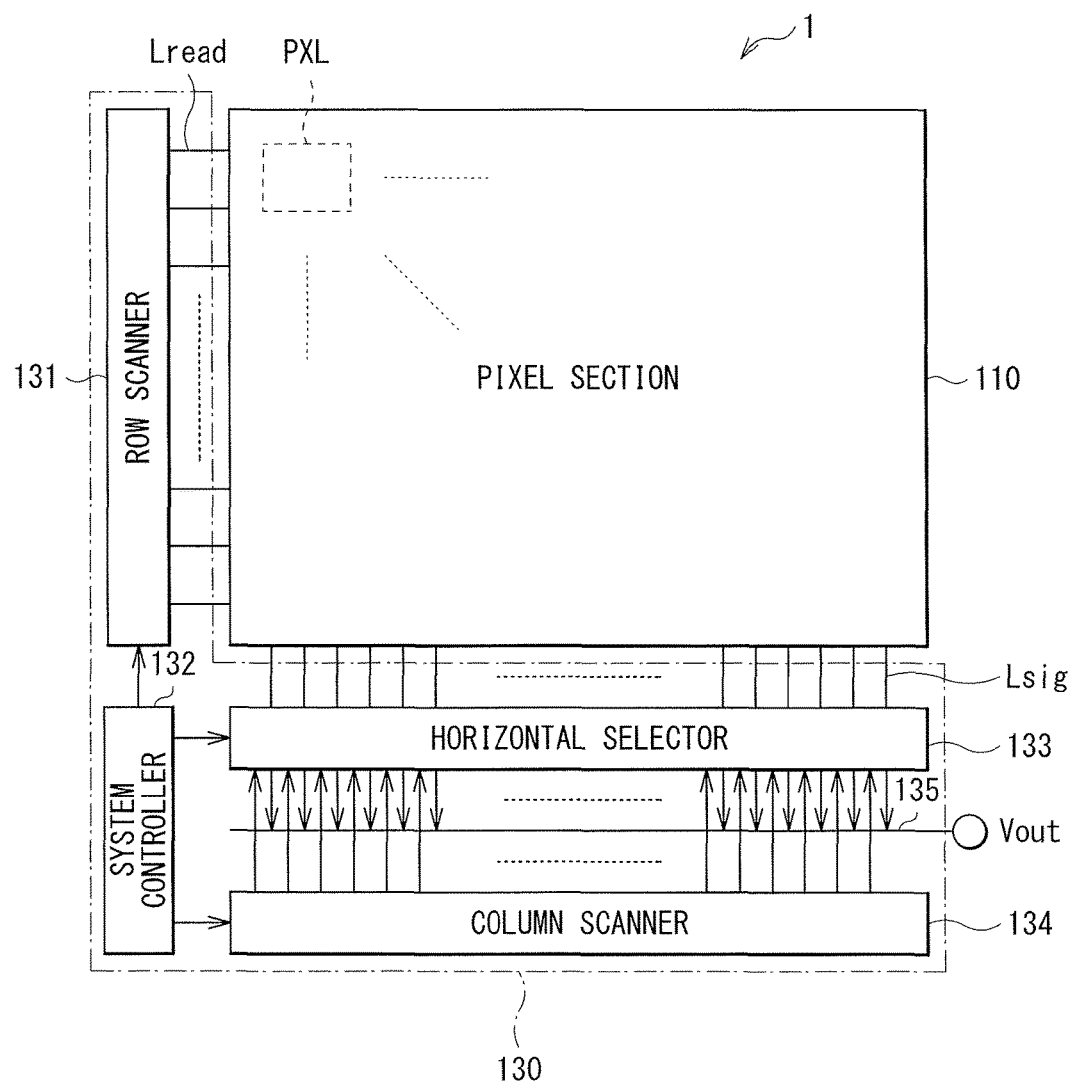
[ FIG. 26 ]

[ FIG. 27 ]
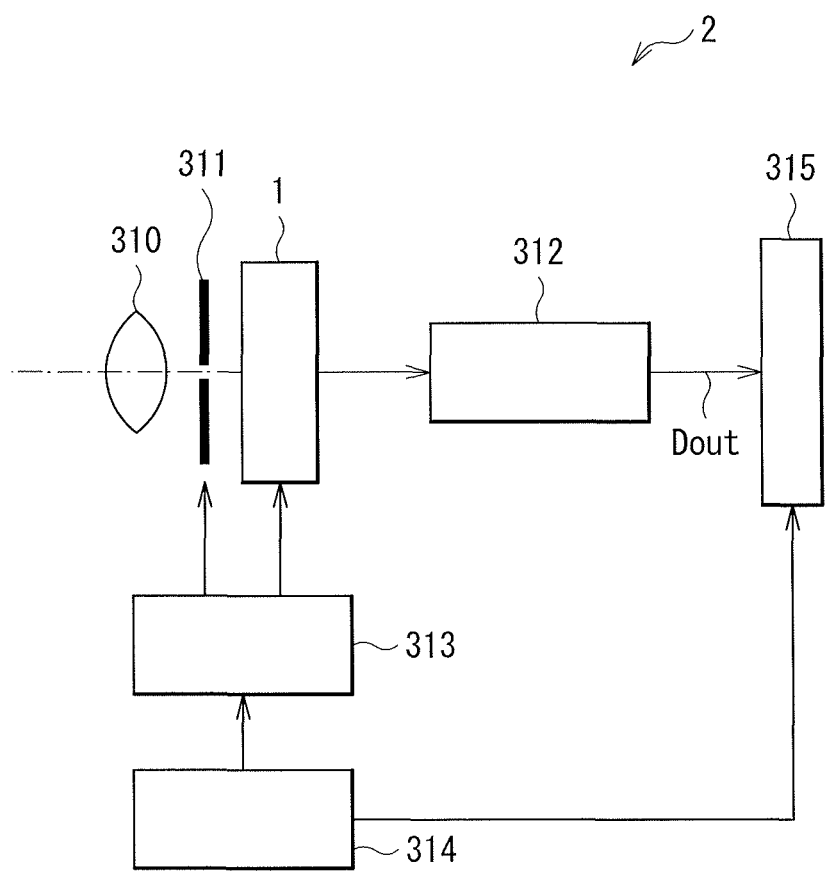

SOLID-STATE IMAGING DEVICE HAVING THROUGH ELECTRODE PROVIDED THEREIN AND ELECTRONIC APPARATUS INCLUDING THE SOLID-STATE IMAGING DEVICE

CROSS REFERENCE TO RELATED APPLICATIONS

This application is a continuation of U.S. patent application Ser. No. 14/911,538, filed Feb. 11, 2016, which claims the benefit of PCT Application No. PCT/JP2014/070842 having an international filing date of Aug. 7, 2014, which designated the United States, which PCT application, which claims the benefit of Japanese Priority Patent Application JP 2013-169553 filed Aug. 19, 2013, the entire disclosures of which are hereby incorporated herein by reference.

TECHNICAL FIELD

The disclosure relates to a solid-state imaging device suitable for a so-called longitudinal stereoscopic type, and an electronic apparatus including the solid-state imaging device.

BACKGROUND ART

CMOS (Complementary Metal-Oxide Semiconductor) image sensors may exemplify solid-state imaging devices installed in digital video cameras, digital still cameras, smartphones, mobile phones, etc. In CMOS image sensors, photoelectric charges are accumulated in pn junction capacitance of photodiodes that serve as photoelectric conversion elements; the photoelectric charges thus accumulated are read out through MOS transistors.

Existing solid-state imaging units generally use a pixel array in which red, green, and blue pixels are arranged on a plane, which causes a false color associated with generation of a color signal by execution of interpolation between pixels. Hence, a study has been made of a longitudinal spectroscopic type solid-state imaging device in which red, green, and blue photoelectric conversion regions are stacked along a longitudinal direction of a same pixel. For example, in Patent Literature 1, there is disclosed a solid-state imaging device in which photodiodes of blue and red are stacked in a semiconductor substrate and a green photoelectric conversion element using an organic photoelectric conversion film is provided on light receiving surface side (rear surface side or first surface side) of the semiconductor substrate.

CITATION LIST

Patent Literature

Patent Literature 1: Japanese Unexamined Patent Application Publication No. 2011-29337

SUMMARY OF INVENTION

Patent Literature 1 describes that charges generated in the green photoelectric conversion element are accumulated in an n-type semiconductor region on wiring layer side (front surface side or second surface side) of the semiconductor substrate via a conductive plug penetrating the semiconductor substrate. The conductive plug is essential to favorably transfer charges from the photoelectric conversion elements on the first surface side of the semiconductor substrate to the second surface side of the semiconductor substrate, thereby enhancing characteristics such as conversion efficiency, and there is still room for study of the configuration of the conductive plug.

It is therefore desirable to provide a solid-state imaging device that allows for enhancement of characteristics and an electronic apparatus including the solid-state imaging device.

A first solid-state imaging device according to an embodiment of the disclosure includes: one or more photoelectric conversion elements provided on side of a first surface of a semiconductor substrate; a through electrode coupled to the one or more photoelectric conversion elements, and provided between the first surface and a second surface of the semiconductor substrate; and an amplifier transistor and a floating diffusion provided on the second surface of the semiconductor substrate, in which the one or more photoelectric conversion elements are coupled to a gate of the amplifier transistor and the floating diffusion via the through electrode.

In the first solid-state imaging device according to the embodiment of the disclosure, charges generated in the photoelectric conversion element on the side of the first surface of the semiconductor substrate are transferred to the side of the second surface of the semiconductor substrate via the through electrode to be accumulated in the floating diffusion. The amplifier transistor modulates an amount of charges generated in the photoelectric conversion element into a voltage.

A second solid-imaging device according to an embodiment of the disclosure includes: a photoelectric conversion element provided on side of a first surface of a semiconductor substrate; a through electrode coupled to the photoelectric conversion element, and provided between the first surface and a second surface of the semiconductor substrate; a separation groove provided between the through electrode and the semiconductor substrate; and a dielectric layer embedded in the separation groove, and having insulation properties.

In the second solid-state imaging device according to the embodiment of the disclosure, the through electrode and the semiconductor substrate are separated from each other by the separation groove and the dielectric layer. Thus, capacitance generated between the through electrode and the semiconductor substrate is reduced, thereby improving characteristics such as conversion efficiency.

A third solid-state imaging device according to an embodiment of the disclosure includes: a photoelectric conversion element provided on side of a first surface of a semiconductor substrate; a through electrode coupled to the photoelectric conversion element, and provided between the first surface and a second surface of the semiconductor substrate; a separation groove provided between the through electrode and the semiconductor substrate; an outer dielectric layer covering an outer side surface of the separation groove; an inner dielectric layer covering an inner side surface of the separation groove; and a gap provided between the outer dielectric layer and the inner dielectric layer.

In the third solid-state imaging device according to the embodiment of the disclosure, the through electrode and the semiconductor substrate are separated from each other by the separation groove, the outer dielectric layer, the inner dielectric layer, and the gap. Thus, capacitance generated between the through electrode and the semiconductor substrate is reduced, thereby improving characteristics such as conversion efficiency.

A first electronic apparatus according to an embodiment of the disclosure is provided with an solid-state imaging device, and the solid-state imaging device includes: one or more photoelectric conversion elements provided on side of a first surface of a semiconductor substrate; a through electrode coupled to the one or more photoelectric conversion elements, and provided between the first surface and a second surface of the semiconductor substrate; and an amplifier transistor and a floating diffusion provided on the second surface of the semiconductor substrate, in which the one or more photoelectric conversion elements are coupled to a gate of the amplifier transistor and the floating diffusion via the through electrode.

A second electronic apparatus according to an embodiment of the disclosure is provided with a solid-state imaging device, and the solid-state imaging device includes: a photoelectric conversion element provided on side of a first surface of a semiconductor substrate; a through electrode coupled to the photoelectric conversion element, and provided between the first surface and a second surface of the semiconductor substrate; a separation groove provided between the through electrode and the semiconductor substrate; and a dielectric layer embedded in the separation groove, and having insulation properties.

A third electronic apparatus according to an embodiment of the disclosure is provided with a solid-state imaging device, and the solid-state imaging device includes: a photoelectric conversion element provided on side of a first surface of a semiconductor substrate; a through electrode coupled to the photoelectric conversion element, and provided between the first surface and a second surface of the semiconductor substrate; a separation groove provided between the through electrode and the semiconductor substrate; an outer dielectric layer covering an outer side surface of the separation groove; an inner dielectric layer covering an inner side surface of the separation groove; and a gap provided between the outer dielectric layer and the inner dielectric layer.

In the first to third electronic apparatuses according to the respective embodiments of the disclosure, imaging is performed by the first to third solid-state imaging devices according to the respective embodiments of the disclosure.

According to the first solid-state imaging device according to the embodiment of the disclosure or the first electronic apparatus according to the embodiment of the disclosure, the photoelectric conversion element is coupled to the gate of the amplifier transistor and the floating diffusion via the through electrode. This makes it possible to favorably transfer, to the side of the second surface of the semiconductor substrate via the through electrode, charges generated in the photoelectric conversion element on the side of the first surface of the semiconductor substrate, thereby enhancing characteristics.

According to the second solid-state imaging device according to the embodiment of the disclosure or the second electronic apparatus according to the embodiment of the disclosure, the through electrode and the semiconductor substrate are separated from each other by the separation groove and the dielectric layer. This makes it possible to reduce capacitance generated between the through electrode and the semiconductor substrate, thereby enhancing characteristics such as conversion efficiency.

According to the third solid-state imaging device according to the embodiment of the disclosure or the third electronic apparatus according to the embodiment of the disclosure, the through electrode and the semiconductor substrate are separated from each other by the separation groove, the outer dielectric layer, the inner dielectric layer, and the gap. This makes it possible to reduce capacitance generated between the through electrode and the semiconductor substrate, thereby enhancing characteristics such as conversion efficiency.

BRIEF DESCRIPTION OF DRAWINGS

FIG. 1 is a sectional view of a configuration of a solid-state imaging device according to a first embodiment of the disclosure.

FIG. 2 is a plan view of a configuration in which four solid-state imaging devices illustrated in FIG. 1 are arranged.

FIG. 3 is a sectional view of a method of manufacturing the solid-state imaging device illustrated in FIG. 1 in the order of procedure.

FIG. 4 is a sectional view of a process following FIG. 3.
FIG. 5 is a sectional view of a process following FIG. 4.
FIG. 6 is a sectional view of a process following FIG. 5.
FIG. 7 is a sectional view of a process following FIG. 6.
FIG. 8 is a sectional view of a process following FIG. 7.
FIG. 9 is a sectional view of a configuration of a solid-state imaging device according to a second embodiment of the disclosure.

FIG. 10 is a sectional view of a method of manufacturing the solid-state imaging device illustrated in FIG. 9 in the order of procedure.

FIG. 11 is a sectional view of a process following FIG. 10.
FIG. 12 is a sectional view of a process following FIG. 11.
FIG. 13 is a sectional view of a process following FIG. 12.
FIG. 14 is a sectional view of a process following FIG. 13.
FIG. 15 is a sectional view of a process following FIG. 14.
FIG. 16 is a sectional view of a process following FIG. 15.
FIG. 17 is a sectional view of a process following FIG. 16.
FIG. 18 is a sectional view of a process following FIG. 17.
FIG. 19 is a sectional view of a configuration of a solid-state imaging device according to Modification Example 1.

FIG. 20 is a sectional view of a configuration of a solid-state imaging device according to a third embodiment of the disclosure.

FIG. 21 is a sectional view of a method of manufacturing the solid-state imaging device illustrated in FIG. 20 in the order of procedure.

FIG. 22 is a sectional view of a process following FIG. 21.
FIG. 23 is a sectional view of a configuration of a solid-state imaging device according to a fourth embodiment of the disclosure.

FIG. 24 is a sectional view of a process of the method of manufacturing the solid-state imaging device illustrated in FIG. 20.

FIG. 25 is a sectional view of a configuration of a solid-state imaging device according to Modification Example 2.

FIG. 26 is a functional block diagram of a solid-state imaging unit.

FIG. 27 is a functional block diagram of an electronic apparatus according to an application example.

MODE FOR CARRYING OUT THE INVENTION

In the following, some embodiments of the disclosure are described in detail with reference to the drawings. It is to be noted that description is given in the following order.

1. First Embodiment (Solid-state imaging device; an example in which a through electrode is made of a semiconductor and a separation groove on the periphery of the through electrode has a gap)
2. Second Embodiment (Solid-state imaging device; an example in which the through electrode is made of a metal and the separation groove on the periphery of the through electrode has a gap)
3. Modification Example 1 (An example in which a thermally-oxidized film is provided on an outer side surface of the separation groove)
4. Third Embodiment (Solid-state imaging device; an example in which the through electrode is made of a semiconductor and the separation groove on the periphery of the through electrode is filled with a dielectric layer)
5. Fourth Embodiment (Solid-state imaging device; an example in which the through electrode is made of a metal and the separation groove on the periphery of the through electrode is filled with the dielectric layer)
6. Modification Example 2 (An example in which a thermally-oxidized film is provided on the outer side surface of the separation groove)
7. Overall Configuration Example of Solid-state Imaging Unit
8. Application Example (An example of an electronic apparatus)

First Embodiment

FIG. 1 illustrates a sectional configuration of a solid-state imaging device 10 according to a first embodiment of the disclosure. The solid-state imaging device 10 may configure, for example, a pixel section as an imaging pixel region in a solid-state imaging unit (to be described later) such as a CMOS image sensor used in electronic apparatuses such as digital still cameras and video cameras.

The solid-state imaging device 10 may be of, for example, a so-called longitudinal spectroscopic type in which one photoelectric conversion element 20 and two photodiodes PD1 and PD2 are stacked along a thickness direction of a semiconductor substrate 30. The photoelectric conversion element 20 is provided on the side of a first surface (rear surface) 30A of the semiconductor substrate 30. The photodiodes PD1 and PD2 are so provided in the semiconductor substrate 30 as to be stacked along the thickness direction of the semiconductor substrate 30.

The photoelectric conversion element 20 and the photodiodes PD1 and PD2 selectively detect light in wavelength ranges different from one another to perform photoelectric conversion on the thus-detected light. More specifically, the photoelectric conversion element 20 obtains a color signal of green (G). The photodiodes PD1 and PD2 respectively obtain color signals of blue (B) and red (R) by a difference in absorption coefficient. This allows the solid-state imaging device 10 to obtain a plurality of kinds of color signals in one pixel without using a color filter.

It is to be noted that, in the embodiment, description is given of a case where electrons of electron-hole pairs generated by photoelectric conversion are read out as signal charges (a case where an N-type semiconductor region serves as a photoelectric conversion layer). Moreover, in the drawing, "+ (plus)" attached to "P" and "N" indicates that P-type or N-type impurity concentration is high, and "++" indicates that P-type or N-type impurity concentration is higher than impurity concentration in "+".

For example, floating diffusions (floating diffusion layers) FD1, FD2, and FD3, a vertical transistor (transfer transistor) Tr1, a transfer transistor Tr2, an amplifier transistor (modulator) AMP, a reset transistor RST, and a multi-layered wiring 40 may be provided on a second surface (front surface) 30B of the semiconductor substrate 30. The multi-layered wiring 40 may have, for example, a configuration in which wiring layers 41, 42, and 43 are stacked in an insulating film 44.

It is to be noted that, in the drawings, the sides of the first surface 30A and the second surface 30B of the semiconductor substrate 30 are respectively referred to as light-entering side S1 and wiring layer side S2.

The photoelectric conversion element 20 may have, for example, a configuration in which a lower transparent electrode 21, a photoelectric conversion film 22, and an upper transparent electrode 23 are stacked in this order from the side of the first surface 30A of the semiconductor substrate 30. The transparent electrode 21 is separated for each photoelectric conversion element 20. The photoelectric conversion film 22 and the transparent electrode 23 are provided as continuous layers shared by a plurality of photoelectric conversion elements 20. For example, a film 24 having a fixed charge, a dielectric layer 25 having insulation properties, and an interlayer insulating film 26 may be provided between the first surface 30A of the semiconductor substrate 30 and the transparent electrode 21. A protective film 27 is provided on the transparent electrode 23. An optical member such as a planarization film and an on-chip lens (none of which is illustrated) are provided above the protective film 27.

A through electrode 50 is provided between the first surface 30A and the second surface 30B of the semiconductor substrate 30. The photoelectric conversion element 20 is coupled to a gate Gamp of the amplifier transistor AMP and the floating diffusion FD3 via the through electrode 50. This allows the solid-state imaging device 10 to favorably transfer, to the side of the second surface 30B of the semiconductor substrate 30 via the through electrode 50, charges generated in the photoelectric conversion element 20 on the side of the first surface 30A of the semiconductor substrate 30, thereby enhancing characteristics.

The through electrode 50 has a function as a connector between the photoelectric conversion element 20 and the gate Gamp of the amplifier transistor AMP and between the photoelectric conversion element 20 and the floating diffusion FD3, as well as serves as a transmission path for charges (here, electrons) generated in the photoelectric conversion element 20. A lower end of the through electrode 50 may be coupled to, for example, a connection section 41A in the wiring layer 41 of the multi-layered wiring 40 via a lower first contact 51. The connection section 41A and the gate Gamp of the amplifier transistor AMP are coupled to each other via a lower second contact 52. The connection section 41A and the floating diffusion FD3 are coupled to each other via a lower third contact 53. An upper end of the through electrode 50 may be coupled to, for example, the lower transparent electrode 21 via an upper contact 54.

FIG. 2 illustrates a planar configuration, viewed from the side of the second surface 30B of the semiconductor substrate 30, of an example of the solid-state imaging device 10 in which a plurality of (for example, four in FIG. 2) photoelectric conversion elements 20 are arranged in two rows by two columns. The through electrode 50 may be preferably provided for each of the plurality of photoelectric conversion elements 20. In other words, as the lower transparent electrode 21 of the photoelectric conversion element 20 is separated for each of the plurality of photoelectric conversion elements 20, the through electrode 50 is also provided for each of the plurality of photoelectric conversion elements 20.

As illustrated in FIGS. 1 and 2, a reset gate Grst of the reset transistor RST may be preferably disposed adjacent to the floating diffusion FD3. This makes it possible to reset charges accumulated in the floating diffusion FD3 by the reset transistor RST.

It is to be noted that FIG. 2 illustrates only the amplifier transistor AMP and the reset transistor RST that process charges from the photoelectric conversion element 20. The transfer transistors Tr1 and Tr2 relating to the photodiodes PD1 and PD2 are not illustrated in FIG. 2, but are appropriately disposed in an unoccupied region.

The through electrode 50 illustrated in FIG. 1 penetrates the semiconductor substrate 30, as well as is separated from the semiconductor substrate 30 by a separation groove 60. The through electrode 50 may be made of, for example, a same semiconductor as a semiconductor of the semiconductor substrate 30, for example silicon (Si), and may preferably have a resistance value reduced by doping with an N-type or P-type impurity (for example, P+ in FIG. 1). Moreover, high-concentration impurity regions (for example, P++ in FIG. 1) may be preferably provided in the upper end and the lower end of the through electrode 50 to further reduce connection resistance with the upper contact 54 and connection resistance with the lower first contact 51.

As illustrated in FIG. 1, an outer side surface 61, an inner side surface 62, and a bottom surface 63 of the separation groove 60 may be covered with the dielectric layer 25 having insulation properties. The dielectric layer 25 may include, for example, an outer dielectric layer 25A covering the outer side surface 61 of the separation groove 60, and an inner dielectric layer 25B covering the inner side surface 62 of the separation groove 60. The outer dielectric layer 25A and the inner dielectric layer 25B may be preferably spaced with a gap 70 between. In other words, the separation groove 60 may have a ring shape or a circular shape, and the gap 70 may have a ring shape or a circular shape that is concentric with the separation groove 60. This makes it possible to reduce capacitance generated between the through electrode 50 and the semiconductor substrate 30, thereby enhancing conversion efficiency as well as suppressing lag (persistence).

In the following, description is given of this. As described above, the through electrode 50 is made of a conductive material such as P+ silicon, and the dielectric layer 25 is provided between the through electrode 50 and the semiconductor substrate 30. Since the through electrode 50 penetrates the semiconductor substrate 30, and is coupled to the amplifier transistor AMP and the floating diffusion FD3, it may be desirable to reduce capacitance generated between the through electrode 50 and the semiconductor substrate 30. The following three measures are considered to reduce the capacitance. A first one of the measures is to reduce area of a side wall of the through electrode 50. A second one of the measures is to increase a distance d between the through electrode 50 and the semiconductor substrate 30. A third one of the measures is to decrease a dielectric constant of an insulator between the through electrode 50 and the semiconductor substrate 30.

Reducing the area of the side wall of the through electrode 50 as the first measure allows for reduction in a thickness of the semiconductor substrate 30 or reduction in a diameter of the through electrode 50. However, this may cause reduction in regions of the photodiodes PD1 and PD2, or an increase in difficulty level of a forming process of the semiconductor substrate 30. Increasing the distance d between the through electrode 50 and the semiconductor substrate 30 as the second measure is a relatively easy measure, but may lead to an increase in device area.

In the embodiment, the gap 70 is provided in the separation groove 60 so as to take the foregoing third measure, i.e., to reduce the dielectric constant of the insulator between the through electrode 50 and the semiconductor substrate 30. Although gas such as hydrogen and nitrogen is present in the gap 70, for example, the dielectric constant of the gas may be lower than a dielectric constant of a dielectric of a solid such as a TEOS (Tetraethyl orthosilicate) film, and may be close to a dielectric constant of vacuum. This makes it possible to remarkably reduce capacitance between the through electrode 50 and the semiconductor substrate 30.

It is to be noted that variation in size of the gap 70 may be preferably as small as possible in the solid-state imaging device 10 or in a wafer, and may be preferably, for example, within plus or minus 10% or less. A reason for this is that the capacitance between the through electrode 50 and the semiconductor substrate 30 is sensitive to the size of the gap 70.

Moreover, in the solid-state imaging device 10, as illustrated in FIG. 1, an impurity region (P+ in FIG. 1) of a same conductive type (N-type or P-type) as a conductive type of the through electrode 50 may be preferably provided on the outer side surface 61 of the separation groove 60 in the semiconductor substrate 30. Further, the film 24 having the fixed charge may be preferably provided on the outer side surface 61, the inner side surface 62, and the bottom surface 63 of the separation groove 60, and the first surface 30A of the semiconductor substrate 30. More specifically, for example, a P-type impurity region (P+ in FIG. 1) as well as a film having a negative fixed charge as the film 24 having the fixed charge may be preferably provided on the outer side surface 61 of the separation groove 60 in the semiconductor substrate 30. This allows for reduction in dark current.

In the followings, description is given of this. In the longitudinal stereoscopic type solid-state imaging device 10, the through electrode 50 and the separation groove 60 are provided for each of the photoelectric conversion elements 20 while being in proximity to the photodiodes PD1 and PD2 in the semiconductor substrate 30. Surfaces of the through electrode 50 and the separation groove 60 are unlike a surface of the semiconductor substrate 30, and are processed by dry etching or other processing, which generally have a large number of defect levels. This may increase dark currents and white spots of the photodiodes PD1 and PD2 adjacent to the through electrode 50 and the separation groove 60.

Here, to reduce the dark currents or the white spots, the P-type impurity region (P+ in FIG. 1) is provided on the outer side surface 61 of the separation groove 60 in the semiconductor substrate 30, and the film having the negative fixed charge is further provided as the film 24 having the fixed charge. An hole accumulation layer is formed on the outer side surface 61 of the separation groove 60 by an electric field induced by the film 24 having the negative fixed charge. The hole accumulation layer suppresses the generation of electrons from the outer side surface 61 of the separation groove 60. Moreover, even if charges (electrons) are generated from the outer side surface 61 of the separation groove 60, the thus-generated electrons disappear in the hole accumulation layer during diffusion of the electrons, and accordingly, the dark currents are reduced.

In the following, description is given of configurations and materials of respective components.

The photoelectric conversion element 20 may be configured to perform photoelectric conversion on green light corresponding to a part or an entirety of a wavelength range of 495 nm to 570 nm both inclusive. The transparent electrodes 21 and 23 may each include, for example, a conductive film having light transparency, and may be made of, for example, ITO (indium tin oxide). The photoelectric conversion film 22 is an organic film made of an organic photoelectric conversion material that photoelectrically converts light in a selective wavelength range while allowing light in other wavelength ranges to pass therethrough. The photoelectric conversion film 22 may be made of, for example, an organic photoelectric conversion material containing a rhodamine-based dye, a merocyanine-based dye, quinacridone, or any other dye. It is to be noted that the photoelectric conversion element 20 may be provided with, in addition to the transparent electrodes 21 and 23 and the photoelectric conversion film 22, other unillustrated layers such as a base layer, an electron block layer, and a buffer layer.

The film 24 having the fixed charge may be a film having a positive fixed charge or a film having a negative fixed charge. Non-limiting examples of a material of the film having the negative fixed charge may include hafnium oxide, aluminum oxide, zirconium oxide, tantalum oxide, and titanium oxide. Moreover, non-limiting examples of the material other than the foregoing materials may include lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, and an aluminum oxynitride film.

The film 24 having the fixed charge may have a configuration in which two or more kinds of films are stacked. For example, in the case of the film having the negative fixed charge, such a configuration makes it possible to further enhance a function as the hole accumulation layer.

Examples of a material of the dielectric layer 25 may include, but not specifically limited to, a silicon oxide film, TEOS, a silicon nitride film, and a silicon oxynitride film.

The interlayer insulating film 26 may be configured of, for example, a silicon oxide film. The protective film 27 may be configured of, for example, a silicon nitride film.

The semiconductor substrate 30 may be configured of, for example, an n-type silicon (Si) substrate, and may have a p-well 31 in a predetermined region. The vertical transistor Tr1, the transfer transistor Tr2, the amplifier transistor AMP, the reset transistor RST, and other components that are described above are provided on the second surface 30B of the p-well 31. Moreover, a peripheral circuit (not illustrated) including, for example but not limited to, a logic circuit is provided on the periphery of the semiconductor substrate 30.

The photodiodes PD1 and PD2 each have PN junction in a predetermined region of the semiconductor substrate 30. The photodiodes PD1 and PD2 allow for dispersion of light toward a longitudinal direction with use of a difference in wavelength of light absorbed according to a light-entering depth in a silicon substrate. The photodiode PD1 selectively detects blue light to accumulate signal charges corresponding to blue, and is disposed at a depth that allows blue light to be photoelectically converted effectively. The photodiode PD2 selectively detects red light to accumulate signal charges corresponding to red, and is disposed at a depth that allows red light to be photoelectrically converted effectively. It is to be noted that blue (B) is a color corresponding to a wavelength range of, for example, 450 nm to 495 nm both inclusive, and red (R) is a color corresponding to a wavelength range of, for example, 620 nm to 750 nm both inclusive. It is only necessary for the respective photodiodes PD1 and PD2 to enable to detect light in a part or an entirety of the respective wavelength ranges.

The photodiode PD1 may include, for example, a P+ region serving as a hole accumulation layer and an N region serving as an electron accumulation layer. The photodiode PD2 may include, for example, a P+ region serving as a hole accumulation layer and an N region serving as an electron accumulation layer (i.e., may have a P-N-P stacking configuration). The N region of the photodiode PD1 is coupled to the vertical transistor Tr1. The P+ region of the photodiode PD1 is bent along the vertical transistor Tr1 to be continuous with the P+ region of the photodiode PD2.

The vertical transistor Tr1 is a transfer transistor that transfers, to the floating diffusion FD1, signal charges (electrons in the embodiment) corresponding to blue that are generated and accumulated in the photodiode PD1. Since the photodiode PD1 is formed at a position deep from the second surface 30B of the semiconductor substrate 30, the transfer transistor of the photodiode PD1 may be preferably configured of the vertical transistor Tr1.

The transfer transistor Tr2 transfers, to the floating diffusion FD2, signal charges (electrons in the embodiment) corresponding to red that are generated and accumulated in the photodiode PD2, and may be configured of, for example, a MOS transistor.

The amplifier transistor AMP is a modulator that modulates an amount of charges generated in the photoelectric conversion element 20 into a voltage, and may be configured of, for example, a MOS transistor.

The reset transistor RST is configured to reset charges transferred from the photoelectric conversion element 20 to the floating diffusion FD3, and may be configured of, for example, a MOS transistor.

The lower first to third contacts 51 to 53 and the upper contact 54 may be made of, for example, a doped silicon material such as PDAS (Phosphorus Doped Amorphous Silicon), or a metal material such as aluminum, tungsten, titanium, cobalt, hafnium, and tantalum.

The solid-state imaging device 10 may be manufactured, for example, as follows.

FIGS. 3 to 8 illustrate a method of manufacturing the solid-state imaging device 10 in the order of procedure. First, as illustrated in FIG. 3, for example, the p-well 31 may be formed as a well of a first conductive type in the semiconductor substrate 30, and the photodiodes PD1 and PD2 of a second conductive type (for example, N-type) may be formed in the P-well 31. A P+ region may be formed in proximity to the first surface 30A of the semiconductor substrate 30.

As illustrated in FIG. 3 as well, an impurity region (P+ region) may be so formed in a region where the through electrode 50 and the separation groove 60 are to be formed as to penetrate from the first surface 30A to the second surface 30B of the semiconductor substrate 30. Moreover, high-concentration impurity regions (P++ regions) may be formed in regions where the upper end and the lower end of the through electrode 50 are to be formed.

As illustrated in FIG. 3 as well, N+ regions that are to serve as the floating diffusions FD1 to FD3 may be formed along the second surface 30B of the semiconductor substrate 30, and thereafter, the gate insulating film 32, and a gate wiring 33 including gates of the vertical transistor Tr1, the transfer transistor Tr2, the amplifier transistor AMP, and the reset transistor RST may be formed on the second surface 30B of the semiconductor substrate 30. The vertical transistor Tr1, the transfer transistor Tr2, the amplifier transistor AMP, and the reset transistor RST may be thus formed. Moreover, the lower first to third contacts 51 to 53 and the multi-layered wiring 40 including the wiring layers 41 to 43 including the connection section 41A, and the insulating film 44 may be formed on the second surface 30B of the semiconductor substrate 30.

An example used as a base of the semiconductor substrate 30 may be a SOI (Silicon on Insulator) substrate in which the semiconductor substrate 30, an embedded oxide film (not illustrated) and a holding substrate (not illustrated) are stacked. The embedded oxide film and the holding substrate, which are not illustrated in FIG. 3, may be bonded to the first surface 30A of the semiconductor substrate 30. Annealing treatment may be performed after ion implantation.

Subsequently, as illustrated in FIG. 4, a support substrate (not illustrated) or any other semiconductor base may be bonded to the side of the second surface 30B (the multi-layered wiring 40) of the semiconductor substrate 30, and the semiconductor substrate 30 may be vertically reversed. Next, the semiconductor substrate 30 may be separated from the embedded oxide film and the holding substrate of the SOI substrate to expose the first surface 30A of the semiconductor substrate 30. The foregoing processes may be carried out by techniques used in a normal CMOS process such as ion implantation and CVD (Chemical Vapor Deposition).

Thereafter, as illustrated in FIG. 5, the semiconductor substrate 30 may be processed from the side of the first surface 30A by, for example, dry etching to form the circular or ring-shaped separation groove 60.

As indicated by an arrow D60A in FIG. 5, a depth of the separation groove 60 may be preferably deep enough to penetrate the semiconductor substrate 30 from the first surface 30A to the second surface 30B and reach the gate insulating film 32. Moreover, in order to further enhance an insulating effect on the bottom surface 63 of the separation groove 60, as indicated by an arrow D60B in FIG. 5, the separation groove 60 may preferably reach the insulating film 44 of the multi-layered wiring 40 through the semiconductor substrate 30 and the gate insulating film 32. FIG. 5 illustrates a case where the separation groove 60 penetrates the semiconductor substrate 30 and the gate insulating film 32.

After forming the separation groove 60, as illustrated in FIG. 6, for example, the film 24 having the negative fixed charge may be formed on the outer side surface 61, the inner side surface 62, and the bottom surface 63 of the separation groove 60, and the first surface 30A of the semiconductor substrate 30. As the film 24 having the negative fixed charge, two or more kinds of films may be stacked. This makes it possible to further enhance the function as the hole accumulation layer.

After forming the film 24 having the negative fixed charge, the dielectric layer 25 including the outer dielectric layer 25A and the inner dielectric layer 25B may be formed as illustrated in FIG. 7. At this occasion, a film thickness and film formation conditions of the dielectric layer 25 may be appropriately adjusted to form the gap 70 in the separation groove 60 between the outer dielectric layer 25A and the inner dielectric layer 25B.

After forming the dielectric layer 25 and the gap 70, as illustrated in FIG. 8, the interlayer insulating film 26 and the upper contact 54 may be formed, and the upper contact 54 may be coupled to the upper end of the through electrode 50. Thereafter, the lower transparent electrode 21, the photoelectric conversion film 22, the upper transparent electrode 23, and the protective film 27 may be formed as illustrated in FIG. 1. Finally, the optical member such as a planarization film and the on-chip lens (not illustrated) may be provided. Thus, the solid-state imaging device 10 illustrated in FIG. 10 is completed.

In the solid-state imaging device 10, when light enters the photoelectric conversion element 20 via the on-chip lens (not illustrated), the light passes through the photoelectric conversion element 20, and the photodiodes PD1 and PD2 in this order to be respectively photoelectrically converted into color light of green, blue, and red in the course of such passage. In the following, description is given of actions of obtaining signals of respective colors.

(Obtaining of Green Signal by Photoelectric Conversion Element 20)

Of light entering the photoelectric conversion element 20, green light is first selectively detected (absorbed) and photoelectrically converted by the photoelectric conversion element 20.

The photoelectric conversion element 20 is coupled to the gate Gamp of the amplifier transistor AMP and the floating diffusion FD3 via the through electrode 50. Electrons of electron-hole pairs generated in the photoelectric conversion element 20 are therefore extracted from the side of the transparent electrode 21 to be transferred to the side of the second surface 30B of the semiconductor substrate 30 via the through electrode 50 and then accumulated in the floating diffusion FD3. Concurrently with this, an amount of charges generated in the photoelectric conversion element 20 is modulated into a voltage by the amplifier transistor AMP.

Moreover, the reset gate Grst of the reset transistor RST is disposed adjacent to the floating diffusion FD3. The charges accumulated in the floating diffusion FD3 are therefore reset by the reset transistor RST.

Here, the photoelectric conversion element 20 is coupled to not only the amplifier transistor AMP but also the floating diffusion FD3 via the through electrode 50, which makes it possible to easily reset the charges accumulated in the floating diffusion FD3 by the reset transistor RST.

In a case where the through electrode 50 and the floating diffusion FD3 are not coupled to each other, it is difficult to reset the charges accumulated in the floating diffusion FD3, and a large voltage is therefore applied to draw the charges to the side of the transparent electrode 23. This may cause damage to the photoelectric conversion film 22. Moreover, since a configuration that allows for resetting in a short time may cause an increase in dark time noise, thereby leading to trade-off, this configuration is difficult.

(Obtaining Blue Signal and Red Signal by Photodiodes PD1 and PD2)

Next, of the light having passed through the photoelectric conversion element 20, blue light and red light are respectively absorbed and photoelectrically converted by the photodiode PD1 and the photodiode PD2 in order. In the photodiode PD1, electrons corresponding to the entered blue light are accumulated in the N region of the photodiode PD1, and the thus-accumulated electrons are transferred to the floating diffusion FD1 by the vertical transistor Tr1. Similarly, in the photodiode PD2, electrons corresponding to the entered red light are accumulated in the N region of the photodiode PD2, and the thus-accumulated electrons are transferred to the floating diffusion FD2 by the transfer transistor Tr2.

Thus, in the embodiment, since the photoelectric conversion element 20 is coupled to the gate Gamp of the amplifier transistor AMP and the floating diffusion FD3 via the through electrode 50, it is possible to favorably transfer, to the side of the second surface 30B of the semiconductor substrate 30 via the through electrode 50, charges generated in the photoelectric conversion element 20 on the side of the first surface 30A of the semiconductor substrate 30, thereby enhancing characteristics.

Moreover, since the through electrode 50 and the semiconductor substrate 30 are separated from each other by the separation groove 60, the outer dielectric layer 25A, the inner dielectric layer 25B, and the gap 70, it is possible to reduce capacitance generated between the through electrode 50 and the semiconductor substrate 30, thereby further improving characteristics such as conversion efficiency.

Further, since the reset gate Grst of the reset transistor RST is disposed adjacent to the floating diffusion FD3, it is possible to easily reset the charges accumulated in the floating diffusion FD3 by the reset transistor RST. This makes it possible to reduce damage to the photoelectric conversion film 22, thereby improving reliability. Furthermore, this makes it possible to reset the charges in a short time without increasing dark time noise.

Second Embodiment

FIG. 9 illustrates a sectional configuration of a solid-state imaging device 10A according to a second embodiment of the disclosure. The solid-state imaging device 10A may include the through electrode 50 made of a metal or a conductive material, but otherwise may have similar configurations, workings, and effects to those of the foregoing first embodiment. Accordingly, description is given with similar components denoted by similar reference numerals.

As with the first embodiment, the solid-state imaging device 10A may be of, for example, a so-called longitudinal spectroscopic type in which one photoelectric conversion element 20 and two photodiodes PD1 and PD2 are stacked along the thickness direction of the semiconductor substrate 30. The photoelectric conversion element 20 is provided on the side of the first surface (rear surface) 30A of the semiconductor substrate 30. The photodiodes PD1 and PD2 are so provided in the semiconductor substrate 30 as to be stacked along the thickness direction of the semiconductor substrate 30.

The photoelectric conversion element 20, the photodiodes PD1 and PD2, and the semiconductor substrate 30 may have similar configurations to those of the first embodiment. The floating diffusions FD1 to FD3, the vertical transistor Tr1, the transfer transistor Tr2, the amplifier transistor AMP, the reset transistor RST, and the multi-layered wiring 40 may have similar configurations to those of the first embodiment.

As with the first embodiment, the through electrode 50 is provided between the first surface 30A and the second surface 30B of the semiconductor substrate 30. The photoelectric conversion element 20 is coupled to the gate Gamp of the amplifier transistor AMP and the floating diffusion FD3 via the through electrode 50. As with the first embodiment, this allows the solid-state imaging device 10 to favorably transfer, to the side of the second surface 30B of the semiconductor substrate 30 via the through electrode 50, charges generated in the photoelectric conversion element 20 on the side of the first surface 30A of the semiconductor substrate 30, thereby enhancing characteristics.

As with the first embodiment, the floating diffusion FD3 is disposed in proximity to the through electrode 50. The reset gate Grst of the reset transistor RST may be preferably disposed adjacent to the floating diffusion FD3. This makes it possible to reset charges accumulated in the floating diffusion FD3 by the reset transistor RST.

In the embodiment, the through electrode 50 may be made of the metal or the conductive material as described above. This makes it possible to further reduce a resistance value of the through electrode 50 and to further reduce connection resistance between the through electrode 50 and the lower first to third contacts 51 to 53 and between the through electrode 50 and the upper contact 54. This makes it possible to more favorably transfer, to the side of the second surface 30B of the semiconductor substrate 30 via the through electrode 50, charges generated in the photoelectric conversion element 20 on the side of the first surface 30A of the semiconductor substrate 30, thereby further enhancing the characteristics. Non-limiting examples of the metal or the conductive material forming the through electrode 50 may include aluminum, tungsten, titanium, cobalt, hafnium, and tantalum.

As with the first embodiment, the separation groove 60 may be preferably provided between the through electrode 50 and the semiconductor substrate 30. The outer side surface 61, the inner side surface 62, and the bottom surface 63 of the separation groove 60 may be preferably covered with the dielectric layer 25 having insulation properties. The outer dielectric layer 25A covering the outer side surface 61 of the separation groove and the inner dielectric layer 25B covering the inner side surface 62 of the separation groove 60 may be preferably spaced with the gap 70 between. This makes it possible to reduce capacitance generated between the through electrode 50 and the semiconductor substrate 30, thereby enhancing conversion efficiency as well as suppressing lag (persistence).

Moreover, in the solid-state imaging device 10A, as with the first embodiment, an impurity region (P+ in FIG. 9) may be preferably provided on the outer side surface 61 of the separation groove 60 in the semiconductor substrate 30. Further, the film 24 having the fixed charge may be preferably provided on the outer side surface 61, the inner side surface 62, and the bottom surface 63 of the separation groove 60, and the first surface 30A of the semiconductor substrate 30. More specifically, for example, a P-type impurity region (P+ in FIG. 9) as well as a film having a negative fixed charge as the film 24 having the fixed charge may be preferably provided on the outer side surface 61 of the separation groove 60 in the semiconductor substrate 30. This allows for reduction in dark current.

As with the first embodiment, the film 24 having the fixed charge may be a film having a positive fixed charge or a film having a negative fixed charge. Non-limiting examples of a material of the film having the negative fixed charge may include hafnium oxide, aluminum oxide, zirconium oxide, tantalum oxide, and titanium oxide. Moreover, non-limiting examples of the material other than the foregoing materials may include lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, and an aluminum oxynitride film.

As with the first embodiment, the film 24 having the fixed charge may have a configuration in with two or more kinds of films are stacked. For example, in the case of the film having the negative fixed charge, such a configuration makes it possible to further enhance a function as the hole accumulation layer.

As with the first embodiment, examples of a material of the dielectric layer 25 may include, but not specifically limited to, a silicon oxide film, TEOS, a silicon nitride film, and a silicon oxynitride film.

As with the first embodiment, the lower first to third contacts 51 to 53 and the upper contact 54 may be made of, for example, a doped silicon material such as PDAS, or a metal material such as aluminum, tungsten, titanium, cobalt, hafnium, and tantalum.

The solid-state imaging device 10A may be manufactured, for example, as follows.

FIGS. 10 to 18 illustrate a method of manufacturing the solid-state imaging device 10A in the order of procedure. First, as with the first embodiment, through the process illustrated in FIG. 3, for example, the p-well 31 may be formed as a well of the first conductive type in the semiconductor substrate 30, and the photodiodes PD1 and PD2 of the second conductive type (for example, N-type) may be formed in the p-well 31. The P+ region may be formed in proximity to the first surface 30A of the semiconductor substrate 30.

Moreover, as with the first embodiment, through the process illustrated in FIG. 3 as well, an impurity region (P+ region) may be so formed in a region where the through electrode 50 and the separation groove 60 are to be formed as to penetrate from the first surface 30A to the second surface 30B of the semiconductor substrate 30. It is to be noted that, in the embodiment, since the through electrode 50 is made of the metal or the conductive material, high-concentration impurity regions (P++ regions) in the upper end and the lower end of the through electrode 50 are unnecessary.

As with the first embodiment, through the process illustrated in FIG. 3 as well, N+ regions that are to serve as the floating diffusions FD1 to FD3 may be formed on the second surface 30B of the semiconductor substrate 30, and thereafter, the gate insulating film 32, and the gate wiring 33 including gates of the vertical transistor Tr1, the transfer transistor Tr2, the amplifier transistor AMP, and the reset transistor RST may be formed on the second surface 30B of the semiconductor substrate 30. The vertical transistor Tr1, the transfer transistor Tr2, the amplifier transistor AMP, and the reset transistor RST may be thus formed. Moreover, the lower first to third contacts 51 to 53 and the multi-layered wiring 40 including the wiring layers 41 to 43 including the connection section 41A, and the insulating film 44 may be formed on the second surface 30B of the semiconductor substrate 30.

As with the first embodiment, an example used as the base of the semiconductor substrate 30 may be the SOI substrate. Annealing treatment may be performed after ion implantation.

Subsequently, as illustrated in FIG. 10, a support substrate (not illustrated) or any other semiconductor base may be bonded to the side of the second surface 30B (the multi-layered wiring 40) of the semiconductor substrate 30, and the semiconductor substrate 30 may be vertically reversed. Next, the semiconductor substrate 30 may be separated from the embedded oxide film and the holding substrate of the SOI substrate to expose the first surface 30A of the semiconductor substrate 30. The foregoing processes may be carried out by techniques used in a normal CMOS process such as ion implantation and CVD (Chemical Vapor Deposition).

Thereafter, as illustrated in FIG. 11, the semiconductor substrate 30 may be processed from the side of the first surface 30A by, for example, dry etching to form the circular or ring-shaped separation groove 60 that penetrates the semiconductor substrate 30.

After forming the separation groove 60, as illustrated in FIG. 12, an insulating film 80 may be formed on the outer side surface 61 and the bottom surface 63 of the separation groove 60, and the first surface 30A of the semiconductor substrate 30. As a material of the insulating film 80, TEOS, or a SiO film, a SiN film, or any other film formed by an ALD method may be used.

Subsequently, as illustrated in FIG. 13, the insulating film 80 may be recessed by dry etching or any other method.

Thereafter, as illustrated in FIG. 14, a metal material film 50A may be embedded in the separation groove 60.

After the metal material film 50A is embedded, as illustrated in FIG. 15, the metal material film 50A may be recessed or planarized by dry etching or CMP (Chemical Mechanical Polishing) to form the through electrode 50. At this occasion, a thickness of the insulating film 80 may be reduced in proximity to an entrance of the separation groove 60 by etching back; therefore, the metal material film 50A may be preferably recessed to a depth where the thickness of the insulating film 80 is secured. This makes it possible to prevent a short circuit between the through electrode 50 and the semiconductor substrate 30.

After forming the through electrode 50, as illustrated in FIG. 16, the insulating film 80 may be removed.

After removing the insulating film 80, as illustrated in FIG. 17, the film 24 having, for example, the negative fixed charge may be formed on the outer side surface 61, the inner side surface 62, and the bottom surface 63 of the separation groove 60, and the first surface 30A of the semiconductor substrate 30. As the film 24 having the negative fixed charge, two or more kinds of films may be stacked. This makes it possible to further enhance the function as the hole accumulation layer.

After forming the film 24 having the negative fixed charge, as illustrated in FIG. 17 as well, the dielectric layer 25 may be formed. At this occasion, the film thickness and film formation conditions of the dielectric layer 25 may be appropriately adjusted to form the gap 70 in the separation groove 60. It is to be noted that a surface of the dielectric layer 25 may be planarized by CMP or any other method.

After forming the dielectric layer 25 and the gap 70, as illustrated in FIG. 18, the interlayer insulating film 26 and the upper contact 54 may be formed, and the upper contact 54 may be coupled to the upper end of the through electrode 50. Thereafter, the lower transparent electrode 21, the photoelectric conversion film 22, and the upper transparent electrode 23, and the protective film 27 may be formed as illustrated in FIG. 9. Finally, the optical member such as a planarization film and the on-chip lens (not illustrated) may be provided. Thus, the solid-state imaging device 10A illustrated in FIG. 9 is completed.

In the solid-state imaging device 10A, when light enters the photoelectric conversion element 20 via the on-chip lens (not illustrated), the light passes through the photoelectric conversion element 20, and the photodiodes PD1 and PD2 in this order to be respectively photoelectrically converted into color light of green, blue, and red in the course of such passage, and signals of respective colors are thus obtained in a similar manner to that of the first embodiment.

Since the through electrode 50 is made of the metal or the conductive material here, it is possible to reduce the resistance value of the through electrode 50, thereby further improving characteristics.

Thus, in the embodiment, the through electrode 50 is made of the metal or the conductive material, which makes it possible to reduce the resistance value of the through electrode 50, thereby further enhancing characteristics.

Modification Example 1

FIG. 19 illustrates a sectional configuration of a solid-state imaging device 10B according to Modification Example 1. The solid-state imaging device 10B may include a thermal oxidized film 34 between the dielectric layer 25 and the through electrode 50 and between the dielectric layer 25 and the semiconductor substrate 30. The thermally oxidized film 34 may be made of, for example but not limited to, a silicon oxide film in which silicon in the semiconductor substrate 30 is thermally oxidized, silicon oxynitride, or a high-dielectric insulating film. Otherwise, the solid-state imaging device 10B may have similar configurations, workings, and effects to those of the foregoing first embodiment. Moreover, the solid-state imaging device 10B may be manufactured in a similar manner to that of the first embodiment, except that the thermally oxidized film 34 is provided on the outer side surface 61 and the inner side surface 62 of the separation groove 60.

Third Embodiment

FIG. 20 illustrates a sectional configuration of a solid-state imaging device 10C according to a third embodiment of the disclosure. The solid-state imaging device 10C is configured to reduce capacitance generated between the through electrode 50 and the semiconductor substrate 30 by filling the separation groove 60 with the dielectric layer 25 having insulation properties, thereby further improving characteristics such as conversion efficiency. Otherwise, the solid-state imaging device 10C may have similar configurations, workings, and effects to those of the foregoing first embodiment.

The solid-state imaging device 10C may be manufactured, for example, as follows.

FIGS. 21 and 22 illustrate a method of manufacturing the solid-state imaging device 10C in the order of procedure. It is to be noted that same processes as those of the first embodiment are described with reference to FIGS. 3 to 6.

First, as with the first embodiment, through the process illustrated in FIG. 3, for example, the p-well 31 may be formed as a well of the first conductive type in the semiconductor substrate 30, and the photodiodes PD1 and PD2 of the second conductive type (for example, N-type) may be formed in the p-well 31. The P+ region may be formed in proximity to the first surface 30A of the semiconductor substrate 30.

Moreover, as with the first embodiment, through the process illustrated in FIG. 3 as well, an impurity region (P+ region) may be so formed in a region where the through electrode 50 and the separation groove 60 are to be formed as to penetrate from the first surface 30A to the second surface 30B of the semiconductor substrate 30. Moreover, high-concentration impurity regions (P++ regions) may be formed in regions where the upper end and the lower end of the through electrode 50 are to be formed.

As with the first embodiment, through the process illustrated in FIG. 3 as well, the N+ regions that are to serve as the floating diffusions FD1 to FD3 may be formed along the second surface 30B of the semiconductor substrate 30, and thereafter, the gate insulating film 32, and the gate wiring 33 including the gates of the vertical transistor Tr1, the transfer transistor Tr2, the amplifier transistor AMP, and the reset transistor RST may be formed on the second surface 30B of the semiconductor substrate 30. The vertical transistor Tr1, the transfer transistor Tr2, the amplifier transistor AMP, and the reset transistor RST may be thus formed. Moreover, the lower first to third contacts 51 to 53 and the multi-layered wiring 40 including the wiring layers 41 to 43 including the connection section 41A, and the insulating film 44 may be formed on the second surface 30B of the semiconductor substrate 30.

As with the first embodiment, an example used as the base of the semiconductor substrate 30 may be the SOI substrate. Annealing treatment may be performed after ion implantation.

Subsequently, as with the first embodiment, through the process illustrated in FIG. 4, a support substrate (not illustrated) or any other semiconductor base may be bonded to the side of the second surface 30B (the multi-layered wiring 40) of the semiconductor substrate 30, and the semiconductor substrate 30 may be vertically reversed. Next, the semiconductor substrate 30 may be separated from the embedded oxide film and the holding substrate of the SOI substrate to expose the first surface 30A of the semiconductor substrate 30. The foregoing processes may be carried out by techniques used in a normal CMOS process such as ion implantation and CVD.

Thereafter, as with the first embodiment, through the process illustrated in FIG. 5, the semiconductor substrate 30 may be processed from the side of the first surface 30A by, for example, dry etching to form the circular or ring-shaped separation groove 60.

After forming the separation groove 60, as with the first embodiment, through the process illustrated in FIG. 6, for example, the film 24 having the negative fixed charge may be formed on the outer side surface 61, the inner side surface 62, and the bottom surface 63 of the separation groove 60, and the first surface 30A of the semiconductor substrate 30. As the film 24 having the negative fixed charge, two or more kinds of films may be stacked. This makes it possible to further enhance the function as the hole accumulation layer.

After forming the film 24 having the negative fixed charge, as illustrated in FIG. 21, the separation groove 60 may be filled with the dielectric layer 25.

After forming the dielectric layer 25, as illustrated in FIG. 22, the interlayer insulating film 26 and the upper contact 54 may be formed, and the upper contact 54 may be coupled to the upper end of the through electrode 50. Thereafter, the lower transparent electrode 21, the photoelectric conversion film 22, the upper transparent electrode 23, and the protective film 27 may be formed as illustrated in FIG. 20. Finally, the optical member such as a planarization film and the on-chip lens (not illustrated) may be provided. Thus, the solid-state imaging device 10C illustrated in FIG. 20 is completed.

Fourth Embodiment

FIG. 23 illustrates a sectional configuration of a solid-state imaging device 10D according to a fourth embodiment of the disclosure. The solid-state imaging device 10D is configured to reduce capacitance generated between the through electrode 50 and the semiconductor substrate 30 by filling the separation groove 60 with the dielectric layer 25 having insulation properties, thereby further improving characteristics such as conversion efficiency. Otherwise, the solid-state imaging device 10D may have similar configurations, workings, and effects to those of the foregoing second embodiment.

As illustrated in FIG. 24, the solid-state imaging device 10D may be manufactured in a similar manner to that of the second embodiment, except that the separation groove 60 is filled with the dielectric layer 25.

Modification Example 2

FIG. 25 illustrates a sectional configuration of a solid-state imaging device 10E according to Modification Example 2. The solid-state imaging device 10E may include the thermally oxidized film 34, which is similar to that of Modification Example 1, between the dielectric layer 25 and the through electrode 50 and between the dielectric layer 25 and the semiconductor substrate 30. As with Modification Example 1, the thermally oxidized film 34 may be made of, for example but not limited to, a silicon oxide film in which silicon in the semiconductor substrate 30 is thermally oxidized, silicon oxynitride, or a high-dielectric insulating film. Otherwise, the solid-state imaging device 10E may have similar configurations, workings, and effects to those of the foregoing third embodiment. Moreover, the solid-state imaging device 10E may be manufactured in a similar manner to that of the third embodiment, except that the thermally oxidized film 34 is provided on the outer side surface 61 and the inner side surface 62 of the separation groove 60.

(Overall Configuration of Solid-state Imaging Unit)

FIG. 26 illustrates an overall configuration of a solid-state imaging unit including, as a pixel section 110, one of the solid-state imaging devices 10 and 10A to 10E described in the foregoing embodiments. The solid-state imaging unit 1 may be, for example, a CMOS image sensor, and may include, for example, the pixel section 110 as an imaging pixel region, as well as a circuit section 130. The circuit section 130 may include, for example, a row scanner 131, a horizontal selector 133, a column scanner 134, and a system controller 132. The circuit section 130 may be provided in a peripheral region around the pixel section 110. Alternatively, the circuit section 130 may be stacked above or below the pixel section 110 (that is, in a region facing the pixel section 110).

The pixel section 110 may include, for example, a plurality of pixels PXL that are arranged in a two-dimensional array. The pixels PXL may be wired with pixel drive lines Lread (specifically, row selector lines and reset control lines) for each pixel row, and may be wired with vertical signal lines Lsig for each pixel column. The pixel drive lines Lread are adapted to transmit drive signals to read signals from the pixels. One ends of the pixel drive lines Lread may be coupled to output terminals that correspond to their respective rows of the row scanner 131.

The row scanner 131 may include, for example, a shift register and an address decoder, and may serve as a pixel drive section that drives the pixels PXL of the pixel section 110, for example, in a row unit. Signals may be outputted from the pixels PXL of a pixel row selected and scanned by the row scanner 131; and the signals thus outputted may be supplied to the horizontal selector 133 through the respective vertical signal lines Lsig. The horizontal selector 133 may include, for example, an amplifier and horizontal selector switches that are provided for each of the vertical signal lines Lsig.

The column scanner 134 may include, for example, a shift register and an address decoder, and is adapted to scan and sequentially drive the horizontal selector switches of the horizontal selector 133. Such selective scanning by the column scanner 134 allows the signals transmitted from the pixels PXL through the respective vertical signal lines Lsig to be sequentially transmitted to a horizontal signal line 135 and to be outputted through the horizontal signal line 135.

The system controller 132 is adapted to receive, for example, a clock supplied from the outside, data on instructions of operation modes, and to output data such as internal information of the solid-state imaging unit 1. Furthermore, the system controller 132 may include a timing generator that generates various timing signals, and is adapted to perform drive control of the row scanner 131, the horizontal selector 133, the column scanner 134, and other parts, based on the various timing signals generated by the timing generator.

Application Example

The solid-state imaging unit according to the forgoing description including the above-described example embodiments may be applied to various electronic apparatuses having imaging functions. Examples may include camera systems such as digital still cameras and video cameras, and mobile phones having imaging functions. FIG. 27 illustrates, for purpose of an example, an overall configuration of an electronic apparatus 2 (e.g., a camera). The electronic apparatus 2 may be a video camera configured to capture still images and moving pictures, and may include the solid-state imaging unit 1, an optical system (an imaging lens) 310, a shutter device 311, a drive section 313 (that includes the above-mentioned circuit section 130), a signal processing section 312, a user interface 314, and a monitor 315. The drive section 313 is adapted to drive the solid-state imaging unit 1 and the shutter device 311.

The optical system 310 is adapted to guide image light (entering light) from an object toward the pixel section 110 of the solid-state imaging unit 1. The optical system 310 may include a plurality of optical lenses. The shutter device 311 is adapted to control a light-irradiating period and a light-shielding period of the solid-state imaging unit 1. The drive section 313 is adapted to control transfer operation of the solid-state imaging unit 1 and shutter operation of the shutter device 311. The signal processing section 312 is adapted to perform various signal processing on signals outputted from the solid-state imaging unit 1. A picture signal Dout after the signal processing may be outputted to the monitor 315. Alternatively, the picture signal Dout may be stored in a storage medium such as a memory. The user interface 314 allows for designation of scenes to be photographed (e.g., designation of dynamic ranges and designation of wavelengths (such as terahertz, visible light, infrared, ultraviolet, and X ray)). Such designation (i.e., an input signal from the user interface 314) may be sent to the drive section 313; based on the designation, desired imaging may be carried out in the solid-state imaging unit 1.

Although description has been made by giving the example embodiments as mentioned above, the contents of the disclosure are not limited to the above-mentioned example embodiments, etc. and may be modified in a variety of ways. For example, the pixel circuit of the solid-state imaging device 10 may have a three-transistor configuration including three transistors in total, including a transfer transistor, an amplifier transistor, and a reset transistor, or four-transistor configuration further including a selection transistor in addition to the three transistors.

Moreover, for example, in the forgoing example embodiments, description has been given on a case where the solid-state imaging unit is applied to a camera as an example; however, the solid-state imaging unit may be also applied to general electronic apparatuses that image light (electromagnetic waves), such as endoscopes, vision chips (artificial retinas), and biosensors.

Moreover, in the forgoing example embodiments, description has been given on the configuration of the backside illuminated type solid-state imaging device 10; however, the contents of the present disclosure are applicable also to a front illuminated type solid-state imaging device.

For example, in the solid-state imaging device 10 and the solid-state imaging unit 1 according to the forgoing example embodiments, it is not necessary to include all the components, and another component or other components may be further provided.

It is to be noted that the contents of the technology may have the following configurations.

(1) A solid-state imaging device including:
one or more photoelectric conversion elements provided on side of a first surface of a semiconductor substrate;
a through electrode coupled to the one or more photoelectric conversion elements, and provided between the first surface and a second surface of the semiconductor substrate; and
an amplifier transistor and a floating diffusion provided on the second surface of the semiconductor substrate,
in which the one or more photoelectric conversion elements are coupled to a gate of the amplifier transistor and the floating diffusion via the through electrode.

(2) The solid-state imaging device according to (1), further including a reset transistor provided on the second surface of the semiconductor substrate, the reset transistor including a reset gate,
in which the reset gate is disposed adjacent to the floating diffusion.

(3) The solid-state imaging device according to (1) or (2), in which
the one or more photoelectric conversion elements include a plurality of photoelectric conversion elements, and
the through electrode is provided for each of the plurality of photoelectric conversion elements.

(4) The solid-state imaging device according to any one of (1) to (3), in which the through electrode penetrates the semiconductor substrate and is separated from the semiconductor substrate by a separation groove.

(5) The solid-state imaging device according to (4), in which
the through electrode is made of a semiconductor doped with an N-type or P-type impurity, and
an impurity region of a same conductive type as a conductive type of the through electrode is provided on an outer side surface of the separation groove in the semiconductor substrate.

(6) The solid-state imaging device according to (4), in which the through electrode is made of a metal or a conductive material.

(7) The solid-state imaging device according to any one of (4) to (6), in which the separation groove is filled with a dielectric layer having insulation properties.

(8) The solid-state imaging device according to any one of (4) to (6), in which
an outer side surface of the separation groove is covered with an outer dielectric layer,
an inner side surface of the separation groove is covered with an inner dielectric layer, and
the outer dielectric layer and the inner dielectric layer are spaced with a gap between.

(9) The solid-state imaging device according to any one of (4) to (8), in which a film having a fixed charge is provided on an outer side surface, an inner side surface, and a bottom surface of the separation groove, and the first surface of the semiconductor substrate.

(10) The solid-state imaging device according to any one of (1) to (9), further including one or more photodiodes provided in the semiconductor substrate.

(11) A solid-state imaging device including:
a photoelectric conversion element provided on side of a first surface of a semiconductor substrate;
a through electrode coupled to the photoelectric conversion element, and provided between the first surface and a second surface of the semiconductor substrate;
a separation groove provided between the through electrode and the semiconductor substrate; and
a dielectric layer embedded in the separation groove, and having insulation properties.

(12) A solid-state imaging device including:
a photoelectric conversion element provided on side of a first surface of a semiconductor substrate;
a through electrode coupled to the photoelectric conversion element, and provided between the first surface and a second surface of the semiconductor substrate;
a separation groove provided between the through electrode and the semiconductor substrate;
an outer dielectric layer covering an outer side surface of the separation groove;
an inner dielectric layer covering an inner side surface of the separation groove; and
a gap provided between the outer dielectric layer and the inner dielectric layer.

(13) An electronic apparatus provided with a solid-state imaging device, the solid-state imaging device including:
one or more photoelectric conversion elements provided on side of a first surface of a semiconductor substrate;
a through electrode coupled to the one or more photoelectric conversion elements, and provided between the first surface and a second surface of the semiconductor substrate; and
an amplifier transistor and a floating diffusion provided on the second surface of the semiconductor substrate,
in which the one or more photoelectric conversion elements are coupled to a gate of the amplifier transistor and the floating diffusion via the through electrode.

(14) An electronic apparatus provided with a solid-state imaging device, the solid-state imaging device including:
a photoelectric conversion element provided on side of a first surface of a semiconductor substrate;
a through electrode coupled to the photoelectric conversion element, and provided between the first surface and a second surface of the semiconductor substrate;
a separation groove provided between the through electrode and the semiconductor substrate; and
a dielectric layer embedded in the separation groove, and having insulation properties.

(15) An electronic apparatus provided with a solid-state imaging device, the solid-state imaging device including:
a photoelectric conversion element provided on side of a first surface of a semiconductor substrate;
a through electrode coupled to the photoelectric conversion element, and provided between the first surface and a second surface of the semiconductor substrate;

a separation groove provided between the through electrode and the semiconductor substrate;
an outer dielectric layer covering an outer side surface of the separation groove;
an inner dielectric layer covering an inner side surface of the separation groove; and
a gap provided between the outer dielectric layer and the inner dielectric layer.

This application claims the benefit of Japanese Priority Patent Application JP 2013-169553 filed on Aug. 19, 2013, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device comprising:
one or more photoelectric conversion elements provided above a first surface of a semiconductor substrate;
a through electrode coupled to the one or more photoelectric conversion elements, wherein the through electrode is provided between the first surface and a second surface of the semiconductor substrate;
an amplifier transistor and a floating diffusion provided on the second surface of the semiconductor substrate; and
a wiring layer provided below the second surface of the semiconductor substrate,
wherein the one or more photoelectric conversion elements are coupled to a gate of the amplifier transistor and the floating diffusion via the through electrode,
wherein the through electrode penetrates the semiconductor substrate,
wherein the through electrode is made of a metal or a conductive material, and
wherein the through electrode is coupled to the floating diffusion via the wiring layer.

2. The solid-state imaging device according to claim 1, wherein the metal or the conductive material is selected from at least one of aluminum, tungsten, titanium, cobalt, hafnium, and tantalum.

3. The solid-state imaging device according to claim 1, wherein the through electrode is separated from the semiconductor substrate by a separation groove.

4. The solid-state imaging device according to claim 3, wherein the separation groove is filled with a dielectric layer having insulation properties.

5. The solid-state imaging device according to claim 4, wherein
an outer side surface of the separation groove is covered with an outer dielectric layer,
an inner side surface of the separation groove is covered with an inner dielectric layer, and
the outer dielectric layer and the inner dielectric layer are spaced with a gap disposed therebetween.

6. The solid-state imaging device according to claim 3, wherein a film having a fixed charge is provided on an outer side surface, an inner side surface, and a bottom surface of the separation groove, and the first surface of the semiconductor substrate.

7. The solid-state imaging device according to claim 1, further comprising a reset transistor provided on the second surface of the semiconductor substrate, the reset transistor including a reset gate, wherein the reset gate is disposed adjacent to the floating diffusion.

8. The solid-state imaging device according to claim 1, wherein
the through electrode is provided for each of one or more photoelectric conversion elements.

9. The solid-state imaging device according to claim 1, further comprising one or more photodiodes provided in the semiconductor substrate.

10. The solid-state imaging device according to claim 1, wherein the through electrode is coupled to the wiring layer via a first contact, and wherein the floating diffusion is coupled to the wiring layer via a second contact.

11. The solid-state imaging device according to claim 1, wherein the through electrode is coupled to the gate of the amplifier transistor via the wiring layer.

12. The solid-state imaging device according to claim 11, wherein the through electrode is coupled to the wiring layer via a first contact, wherein the floating diffusion is coupled to the wiring layer via a second contact, and wherein the gate of the amplifier transistor is coupled to the wiring layer via a third contact.

13. The solid-state imaging device according to claim 1, wherein the first surface of the semiconductor substrate is a light receiving surface of the semiconductor substrate.

14. A solid-state imaging device comprising:
a photoelectric conversion element provided above a first surface of a semiconductor substrate,
wherein the photoelectric conversion element includes a photoelectric conversion film provided between transparent electrodes;
a through electrode coupled to the photoelectric conversion element, wherein the through electrode is provided between the first surface and a second surface of the semiconductor substrate, and wherein the through electrode is made of a metal or a conductive material;
a separation groove provided between the through electrode and the semiconductor substrate; and
a dielectric layer embedded in the separation groove, wherein the dielectric layer has insulation properties,
wherein the first surface of the semiconductor substrate is disposed between the photoelectric conversion element and the second surface of the semiconductor substrate.

15. A solid-state imaging device comprising:
a photoelectric conversion element provided above a first surface of a semiconductor substrate,
wherein the photoelectric conversion element includes a photoelectric conversion film provided between transparent electrodes;
a through electrode coupled to the photoelectric conversion element, wherein the through electrode is provided between the first surface and a second surface of the semiconductor substrate, and wherein the through electrode is made of a metal or a conductive material;
a separation groove provided between the through electrode and the semiconductor substrate;
an outer dielectric layer covering an outer side surface of the separation groove;
an inner dielectric layer covering an inner side surface of the separation groove; and
a gap provided between the outer dielectric layer and the inner dielectric layer,
wherein the first surface of the semiconductor substrate is disposed between the photoelectric conversion element and the second surface of the semiconductor substrate.

16. An electronic apparatus, comprising:
an optical system;
a solid-state imaging device comprising:
- one or more photoelectric conversion elements provided above a first surface of a semiconductor substrate;
- a through electrode coupled to the one or more photoelectric conversion elements, wherein the through electrode is provided between the first surface and a second surface of the semiconductor substrate;
- an amplifier transistor and a floating diffusion provided on the second surface of the semiconductor substrate; and
- a wiring layer provided below the second surface of the semiconductor substrate,
- wherein the one or more photoelectric conversion elements are coupled to a gate of the amplifier transistor and the floating diffusion via the through electrode,
- wherein the through electrode penetrates the semiconductor substrate,
- wherein the through electrode is made of a metal or a conductive material, and
- wherein the through electrode is coupled to the floating diffusion via the wiring layer; and a signal processing section.

17. The electronic apparatus according to claim 16, wherein the metal or the conductive material is selected from at least one of aluminum, tungsten, titanium, cobalt, hafnium, and tantalum.

18. The electronic apparatus according to claim 16, wherein the through electrode is separated from the semiconductor substrate by a separation groove.

19. The electronic apparatus according to claim 16, further comprising a reset transistor provided on the second surface of the semiconductor substrate, the reset transistor including a reset gate, wherein the reset gate is disposed adjacent to the floating diffusion.

20. The electronic apparatus according to claim 16, wherein the through electrode is provided for each of one or more photoelectric conversion elements.

* * * * *